US012757723B2

(12) United States Patent
Chen et al.

(10) Patent No.: US 12,757,723 B2
(45) Date of Patent: Oct. 6, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Tzu Pei Chen, Taipei City (TW); Min-Hsuan Lu, Hsinchu City (TW); Hao-Heng Liu, Hsinchu City (TW); Yuting Cheng, Toayuan City (TW); Hsu-Kai Chang, Hsinchu (TW); Po-Chin Chang, Taichung City (TW); Olivia Pei-Hua Lee, Hsinchu County (TW); Sheng-Tsung Wang, Hsinchu (TW); Huan-Chieh Su, Changhua County (TW); Sung-Li Wang, Hsinchu County (TW); Pinyen Lin, Rochester, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 365 days.

(21) Appl. No.: 18/484,419

(22) Filed: Oct. 10, 2023

(65) Prior Publication Data

US 2025/0118666 A1 Apr. 10, 2025

(51) Int. Cl.
*H10W 20/41* (2026.01)
*H10D 84/01* (2025.01)
(Continued)

(52) U.S. Cl.
CPC ...... *H10W 20/435* (2026.01); *H10D 84/0147* (2025.01); *H10D 84/0149* (2025.01);
(Continued)

(58) Field of Classification Search
CPC ............. H10W 20/435; H10W 20/063; H10W 20/069; H10W 20/076; H10W 20/033;
(Continued)

(56) References Cited

U.S. PATENT DOCUMENTS

| | | | | |
|---|---|---|---|---|
| 6,160,277 A * | 12/2000 | Prall | .................. | H10W 20/069 257/E21.507 |
| 2022/0223526 A1* | 7/2022 | Min | ..................... | H10D 62/151 |

OTHER PUBLICATIONS

A. Kiani, K. Venkatakrishnan, B. Tan, and V. Venkataramanan, "Maskless lithography using silicon oxide etch-stop layer induced by megahertz repetition femtosecond laser pulses," Opt. Express 19, 10834-10842. (Year: 2011).*

(Continued)

*Primary Examiner* — Fernando L Toledo
*Assistant Examiner* — Jorge Andres Lopez
(74) *Attorney, Agent, or Firm* — WPAT LAW; Anthony King

(57) ABSTRACT

A semiconductor structure and method of manufacturing a semiconductor structure are provided. The semiconductor structure includes a substrate and at least one contact plug. The substrate has an epi-layer. The contact plug is formed on the epi-layer and includes a silicide cap disposed on the epi-layer; a conductive pillar disposed on the silicide cap such that the conductive pillar electrically connects to the epi-layer via the silicide cap; and a hybrid liner. The hybrid liner surrounds the conductive pillar and includes a lower portion abutting the silicide cap and having a nitride material and an upper portion abutting the conductive pillar and having an oxidized nitride material. Due to the hybrid liner, a semiconductor structure with increased capacitance and decreased resistivity can be obtained.

20 Claims, 29 Drawing Sheets

(51) Int. Cl.
*H10D 84/03* (2025.01)
*H10D 84/83* (2025.01)
*H10W 20/00* (2026.01)

(52) U.S. Cl.
CPC ........... *H10D 84/038* (2025.01); *H10D 84/83* (2025.01); *H10W 20/063* (2026.01); *H10W 20/069* (2026.01); *H10W 20/076* (2026.01)

(58) Field of Classification Search
CPC ............. H10W 20/047; H10W 20/048; H10W 20/077; H10W 20/40; H10D 84/0147; H10D 84/0149; H10D 84/038; H10D 84/83; H10D 64/01125; H10D 64/0112
See application file for complete search history.

(56) References Cited

OTHER PUBLICATIONS

Kiani, A., Venkatakrishnan, K., Tan, B. and Venkataramanan, V. (2011) Maskless Lithography Using Silicon Oxide Etch-Stop Layer Induced by Megahertz Repetition Femtosecond Laser Pulses. Optics Express, 19, 10834-10842. http://dx.doi.org/10.1364/OE.19.010834 (Year: 2011).*

* cited by examiner

SEMICONDUCTOR STRUCTURE AND METHOD OF MANUFACTURING THE SAME

BACKGROUND

This disclosure generally relates to a semiconductor structure and a method of manufacturing the same.

With advances in semiconductor technology, there has been increasing demand for faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs. Such scaling down has increased the complexity of semiconductor manufacturing processes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
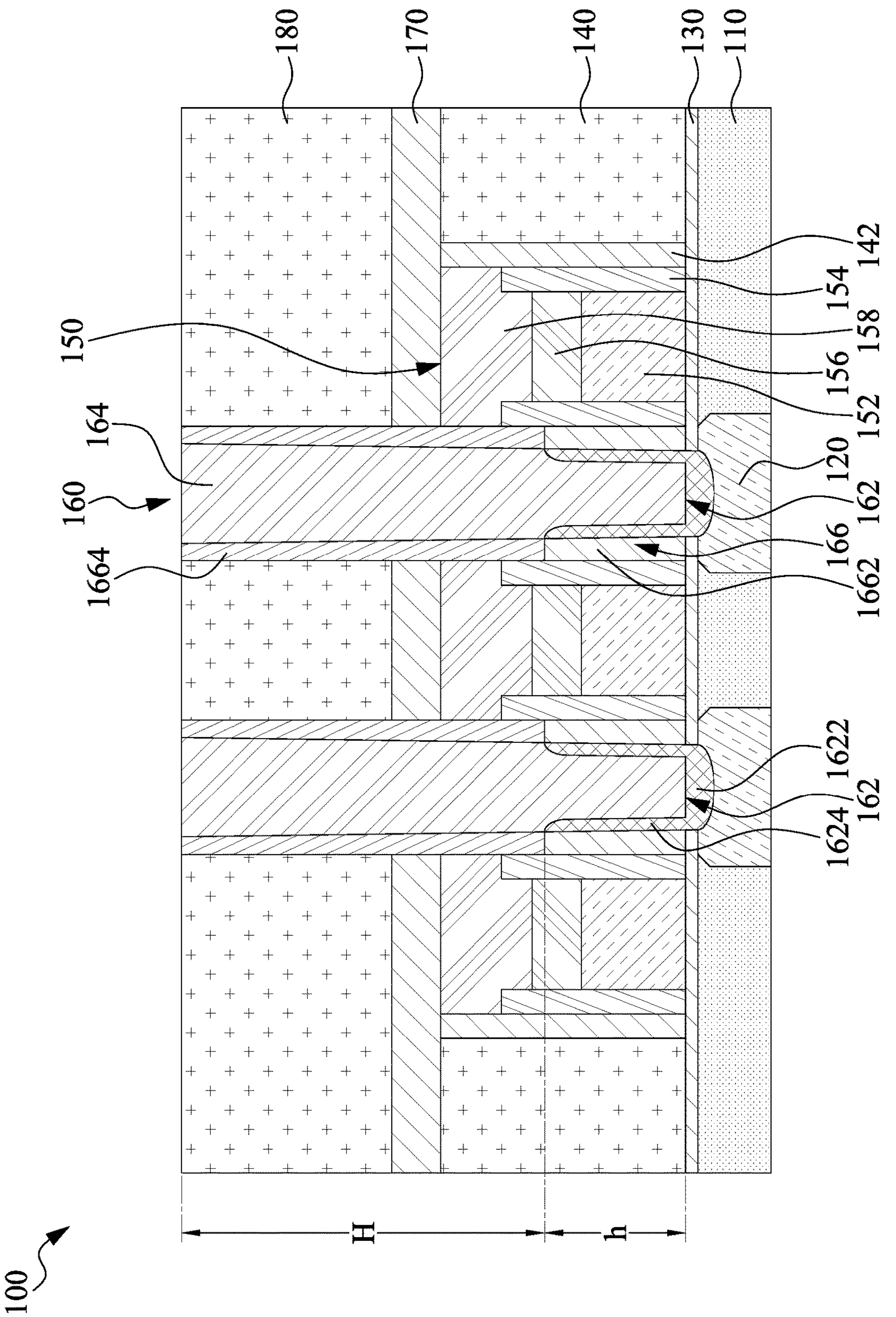
FIG. 1 is a schematic cross-sectional diagram of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 100 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

In a semiconductor device, a component (e.g., active region, metal over diffusion (MD) region, or other metal structure) uses a nitride-based material as a liner to reduce sidewall oxide damage during a pre-clean procedure and leakage. However, such nitride-based spacer would scarify the resistivity and capacitance of the component. Improved strategy for decreasing resistivity and capacitance reduction of such component in semiconductor devices would be needed.

FIG. 1 is a schematic cross-sectional diagram of a semiconductor structure 100 in accordance with some embodiments of the present disclosure. FIG. 1 has been simplified for the sake of clarity to better understand the inventive concepts of the present disclosure. The semiconductor structure 100 may include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), p-channel metal-oxide-semiconductor field effect transistors (PFETs), n-channel metal-oxide-semiconductor field effect transistor (NFETs), high voltage transistors, and/or high frequency transistors; other suitable components; or combinations thereof. Additional features can be added in the semiconductor structure 100, and some of the features described below can be replaced or eliminated for additional embodiments of the semiconductor structure 100.

Figure 2:
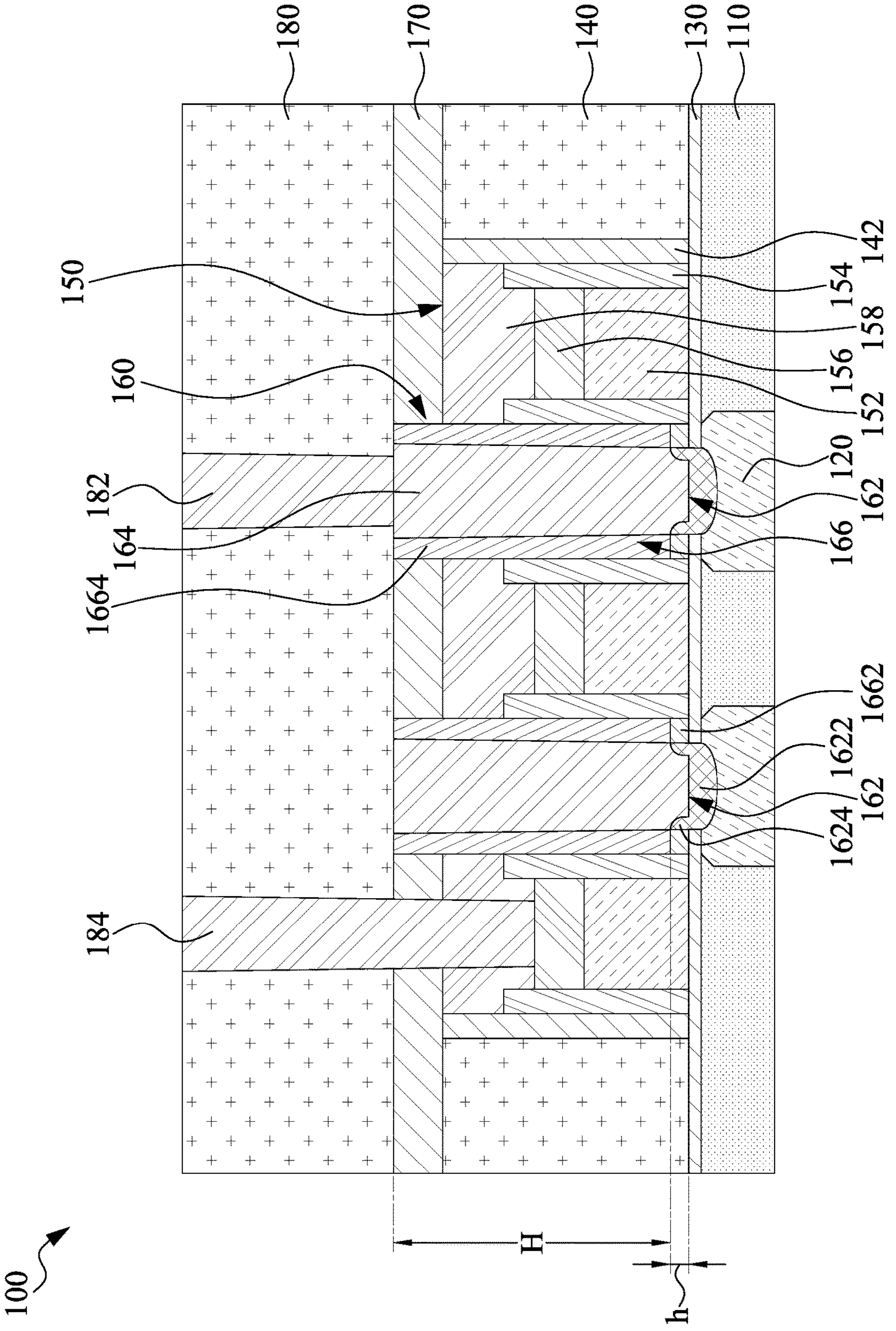
FIG. 2 is a schematic cross-sectional diagram of a semiconductor structure, in accordance with some another embodiments of the present disclosure.

In FIGS. 1 and 2, the semiconductor structure 100 includes a substrate 110, at least one epi-layer 120, a first etch stop layer 130, a plurality of interlayer dielectric (ILD) structures 140, a plurality of gate structures 150, at least one contact plug 160, a second etch stop layer 170, an inter-metal dielectric layer 180 and a plurality of plugs 182, 184. The semiconductor structure 100 may include additional features that are not illustrated. For example, lightly doped source/drain (LDD) regions and/or heavily doped source/drain (HDD) regions may be formed by ion implantation or diffusion of n-type dopants, such as phosphorous or arsenic, or p-type dopants, such as boron. The LDD and/or HDD regions may be interposed by the respective gate structures 150.

In some embodiments, the substrate 110 is a semiconductor substrate including silicon. The substrate 110 may be a p-type or n-type substrate. Alternatively or additionally, the substrate 110 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In certain embodiments, the substrate 110 is a semiconductor on insulator (SOI). In alternative embodiments, the substrate 110 may include a doped epi layer, a gradient semiconductor layer, and/or a semiconductor layer overlying another semiconductor layer of a different type, such as a silicon layer on a silicon germanium layer. The substrate 110 may include various doped regions depending on design requirements of the semiconductor structure 100 (e.g., p-type wells or n-type wells). The doped regions may be doped with p-type dopants, such as boron or $BF_2$; n-type dopants, such as phosphorus or arsenic; or a combination thereof. The doped regions may be disposed directly on the substrate 110, in a P-well structure, in an N-well structure, in a dual-well structure, or using a raised structure.

The epi-layer 120 formed from such as silicon or silicon-germanium, is disposed in the substrate 110. In some embodiments, an epitaxy or epitaxial (epi) process may be used to form the epi-layer 120. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors, which may interact with the composition of the substrate 110. The deposited semiconductor material provides stress or strain to the channel regions of the semiconductor structure 100 to enhance carrier mobility of the device and enhance device performance. In the depicted embodiment, silicon germanium (SiGe) is deposited by an epi process to form a SiGe source and drain feature. The epi-layer 120 may be doped with a suitable dopant, such as boron (B). Alternatively, the source and drain feature is silicon (Si) source and drain features, which may be doped with a suitable dopant, such as carbon (C). The epi-layer 120 may be in-situ doped or undoped during the epi process, and then doped in a subsequent process. The doping may be achieved by an ion implantation process, plasma immersion ion implantation (PIII) process, gas and/or solid source diffusion process, other suitable process, or combinations thereof. The epi-layer 120 may further be exposed to an annealing process, such as a rapid thermal annealing process.

The first etch stop layer 130 is disposed on the substrate 110 for preventing problems caused by contact misalignment. In some embodiments, the first etch stop layer 130 may be formed from commonly used materials including, but not limited to, LaO, AlO, YO, TaCN, ZrSi, SiOCN, SiOC, ZrN, ZrAlO, TiO, TaO, ZrO, HfO, SiN, HfSi, AlON, SiO, SiC, ZnO or combinations thereof. In alternative embodiments, the first etch stop layer 130 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used.

The interlayer (or inter-level) dielectric (ILD) structures 140 formed on the first etch stop layer 130 and formed from a dielectric layer, for example, is disposed on the first etch stop layer 130. The ILD structures 140 include a dielectric material, such as silicon oxide, silicon nitride, silicon oxynitride, low-k dielectric material, other suitable dielectric materials, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In some embodiments, the ILD structures 140 are formed from LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO and the like. The ILD structure 140 may include a multilayer structure having multiple dielectric materials, and additional layers may be disposed overlying and/or underlying the ILD structure 140. In some embodiments, each of the ILD structures 140 has a thickness from about 3 nm to about 40 nm. In some embodiments, each of the ILD structures 140 has a thickness from about 5 nm to about 30 nm. In some embodiments, each of the ILD structures 140 has a thickness from about 8 nm to about 20 nm.

The gate structures 150 are formed on the first etch stop layer 130. In some embodiments, the gate structures 150 may be formed adjacent to the ILD structure 140 where a barrier 142 is formed between the gate structure 150 and the ILD structure 140. In some embodiments, the gate structures 150 are formed by deposition processes, lithography patterning processes, etching processes, or a combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include resist coating (such as spin-on coating), soft baking, mask aligning, exposure, post-exposure baking, developing the resist, rinsing, drying (such as hard baking), other suitable processes, or combinations thereof. Alternatively, the lithography exposing process is implemented or replaced by other proper methods, such as maskless photolithography, electron-beam writing, or ion-beam writing. The etching processes include dry etching, wet etching, other etching methods, or combinations thereof.

In some embodiment, the gate structures 150 formed on the first etch stop layer 130 and each gate structure 150 comprises a gate electrode 152, a spacer 154, a conductive layer 156 and a dielectric layer 158. The gate electrode 152 is formed on the first etch stop layer 130. In some embodiments, the gate electrode 152 may be single-layer structure. In some alternative embodiments, the gate electrode 152 may be a multi-layer structure. In some embodiments, the material of the gate electrode 152 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, the method of forming the gate electrode 152 may include a deposition process and then a planarization process. The deposition process may include atomic layer deposition (ALD), molecular beam deposition (MBD), chemical vapor deposition (CVD), physical vapor deposition (PVD), flowable chemical vapor deposition (FCVD), or a combination thereof. The planarization process may include a chemical mechanical polishing (CMP) process, an etch process, or other suitable process. Moreover, the gate electrode 152 may further include a barrier layer, a work function layer, a liner layer, an interface layer, a seed layer, an adhesion layer, etc. In some embodiments, the gate electrode 152 is also referred as a metal gate (MG), for example.

In some embodiments, the spacer 154 is formed along a sidewall of the gate electrode 152. The spacer 154 is a single-layer. In some alternative embodiments, the spacer 154 may be multiple-layer structure. In some embodiments, the material of the spacer 154 includes $SiO_2$, SiN, SiON, SiCN, SiOCN or other suitable material. In some embodiments, the material of the spacer 154 may be SiOCN. In some embodiments, the spacer 154 may have a thickness in the range of about 1 nm to about 5 nm, such as about 2 nm to about 3 nm. In some embodiments, the method of forming the spacer 154 may include a deposition process and then an etching process. The deposition process may include atomic layer deposition (ALD), molecular beam deposition (MBD), chemical vapor deposition (CVD), physical vapor deposition (PVD), flowable chemical vapor deposition (FCVD), or a combination thereof. The etching process may include an anisotropic etching process or other suitable process.

The conductive layer 156 is formed on the gate electrode 114 and surrounded by the spacer 154. In some embodiments, the conductive layer 156 has a top surface lower than a top surface of the spacer 154. However, the disclosure is not limited thereto; in some alternative embodiments, the conductive layer 156 may have the top surface substantially flush with or coplanar with the top surface of the spacer 154. In some embodiments, the material of the conductive layer 156 includes aluminum (Al), tungsten (W), copper (Cu), combinations thereof or any other suitable conductive material. In some embodiments, the material of the conductive layer 156 includes fluorine-free tungsten, for example. In some alternative embodiments, the conductive layer 156 is optional, that is, the conductive layer 156 may be omitted.

The dielectric layer 158 is formed on the conductive layer 156 and the spacer 154. In some embodiments, the dielectric layer 158 has a top surface substantially flush with or coplanar with the top surface of the ILD structure 140. In some embodiments, the dielectric layer 158 has a different etch selectivity from the ILD structure 140. In some embodiments, the material of the dielectric layer 158 includes high k dielectrics with a k constant larger than 10 such as metal oxides, metal nitrides, metal silicates or other suitable high k dielectrics. In some embodiments, the high k dielectrics include $ZrO_2$, $HfO_2$, HfSiO, ZrSiO, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, a combination thereof or other suitable material. In some embodiments, the material of the dielectric layer 158 may be $ZrO_2$. In some embodiments, the method of forming the dielectric layer 158 may include a deposition process and then a planarization process. The deposition process may include atomic layer deposition (ALD), molecular beam deposition (MBD), chemical vapor deposition (CVD), physical vapor deposition (PVD), or a combination thereof. The planarization process may be performed by using the top surface of the ILD structure 140 as a stop layer and may include a CMP process, an etch process, or other suitable process.

The contact plug 160 formed on the epi-layer 120 and comprises a silicide cap 162, a conductive pillar 164 and a hybrid liner 166. The silicide cap 162 is disposed on the epi-layer 120 and surrounded by the first etch stop layer 130. In some embodiments, the silicide cap 162 is formed from RuSi, CoSi, MoSi, NiSi, PtSi, TaSi, WSi, CrSi, ZrSi and the like. In alternative embodiments, the silicide cap 162 is formed by the operation of forming a metal layer (not shown) on the epi-layer 120 and then annealing the metal layer. The operation of forming the metal layer on the epi-layer 120 may be performed using a chemical vapor deposition (CVD) process, a physical vapor deposition (PVD) process or a high density plasma (HDP) process.

In some embodiments, the silicide cap 162 has a U-shape cross section and has a cap body 1622 and a cap wall 1624. The cap body 1622 is disposed on the epi-layer 120 and surrounded by the first etch stop layer 130. The cap wall 1624 protrudes from an edge of the cap body 1622 toward a direction opposite to the epi-layer 120 and surrounds a lower portion of the conductive pillar 164.

The conductive pillar 164 is disposed on the silicide cap 162 such that the conductive pillar 164 electrically connects to the epi-layer 120 via the silicide cap 162. In some embodiments, the conductive pillar 164 includes W, Ru, Al, Mo, Ti, TiN, Cu, TaN, Co or other metal materials or alloys. In alternative embodiments, the conductive pillar 164 is formed using a CVD process.

The hybrid liner 166 is formed on the first etch stop layer 130 to surround the conductive pillar 164. A thickness of the hybrid liner 166 is about 0.5 nm to about 4 nm. The hybrid liner 166 includes a lower portion 1662 and an upper portion 1664. The lower portion 1662 is formed on the first etch stop layer 130 and abuts the cap body 1622 and the spacer 154 of the gate structure 150, so that the lower portion 1662 is sandwiched between the cap body 1622 and the spacer 154 of the gate structure 150. A top of the lower portion 1662 is coplanar with a top surface of the cap wall 1624. The lower portion 1662 includes a nitride material, such as silicon nitride.

The upper portion 1664 is formed on the lower portion 1662 and surrounds and abuts the conductive pillar 164. A top of the upper portion 1664 is coplanar with a top surface of the conductive pillar 164. The upper portion 1664 includes an oxidized nitride material and thus transfers a nitride material to oxide-like material with lower dielectric constant (κ, kappa) because a nitride material has a κ value higher than a κ value of an oxidized nitride material. For example, SiN has a κ value of about 7.0 while $SiO_2$ has a κ value of about 3.9. In some embodiments, a height H of the upper portion 1664 and a height h of the lower portion 1662 is at a ratio of about 50:1 to about 1:1. In some embodiments, the height H of the upper portion 1664 and the height h of the lower portion 1662 is at a ratio of about 40:1 to about 10:1. In some embodiments, the height H of the upper portion 1664 and the height h of the lower portion 1662 is at a ratio of about 30:1 to about 15:1. Due to such hybrid liner 166 in replacement of a single-material liner (such as a nitride liner), increased effective capacitance ($C_{eff}$%) of the semiconductor structure can be gained and a lower resistivity can be achieved.

The second etch stop layer 170 is disposed on the ILD structure 140 and the dielectric layer 158 of the gate structures 150 for preventing problems caused by contact misalignment. In some embodiments, the second etch stop layer

170 may be formed from commonly used materials including, but not limited to, LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, or combinations thereof. In alternative embodiments, the second etch stop layer 170 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used. In some embodiments, a thickness of the second etch stop layer 170 is about 3 nm to about 20 nm.

In some embodiment as shown in FIG. 1, the contact plug 160 extends upward and passes through the second etch stop layer 170 so that a top surface of the second etch stop layer 170 is lower than the top of the upper portion 1664 and the top surface of the conductive pillar 164. Further, in another some embodiment as shown in FIG. 2, the top of the upper portion 1664 and the top surface of the conductive pillar 164 are coplanar with a top surface of the second etch stop layer 170.

The inter-metal dielectric layer 180 is formed on the second etch stop layer 170. In some embodiments, the inter-metal dielectric layer 180 may be formed from the materials similar to the materials forming the ILD structure 140. In certain embodiments, the inter-metal dielectric layer 180 may be formed using the processes similar to the processes forming the ILD structure 140. In some embodiment as shown in FIG. 1, the contact plug 160 extends upward and passes through the second etch stop layer 170 and the inter-metal dielectric layer 180 so that the top surface of the second etch stop layer 170 is coplanar with an upper surface of the inter-metal dielectric layer 180.

As shown in FIG. 2, the plugs 182, 184 are formed in the inter-metal dielectric layer 180 and upper surfaces of the plugs 182, 184 are coplanar with the upper surface of the inter-metal dielectric layer 180. The plugs 182, 184 includes W, Ru, Al, Mo, Ti, TiN, Cu, TaN, Co or other metal materials or alloys. In some embodiments, the plug 182 is formed on the conductive pillar 164 and electrically connects to the conductive pillar 164. In some embodiments, the plug 184 is formed on the conductive layer 156 of the gate structure 150 and extends upward to pass through the second etch stop layer 170 and the inter-metal dielectric layer 180 until the upper surface of the plug 184 is aligned with the upper surface of the inter-metal dielectric layer 180.

Figure 3:
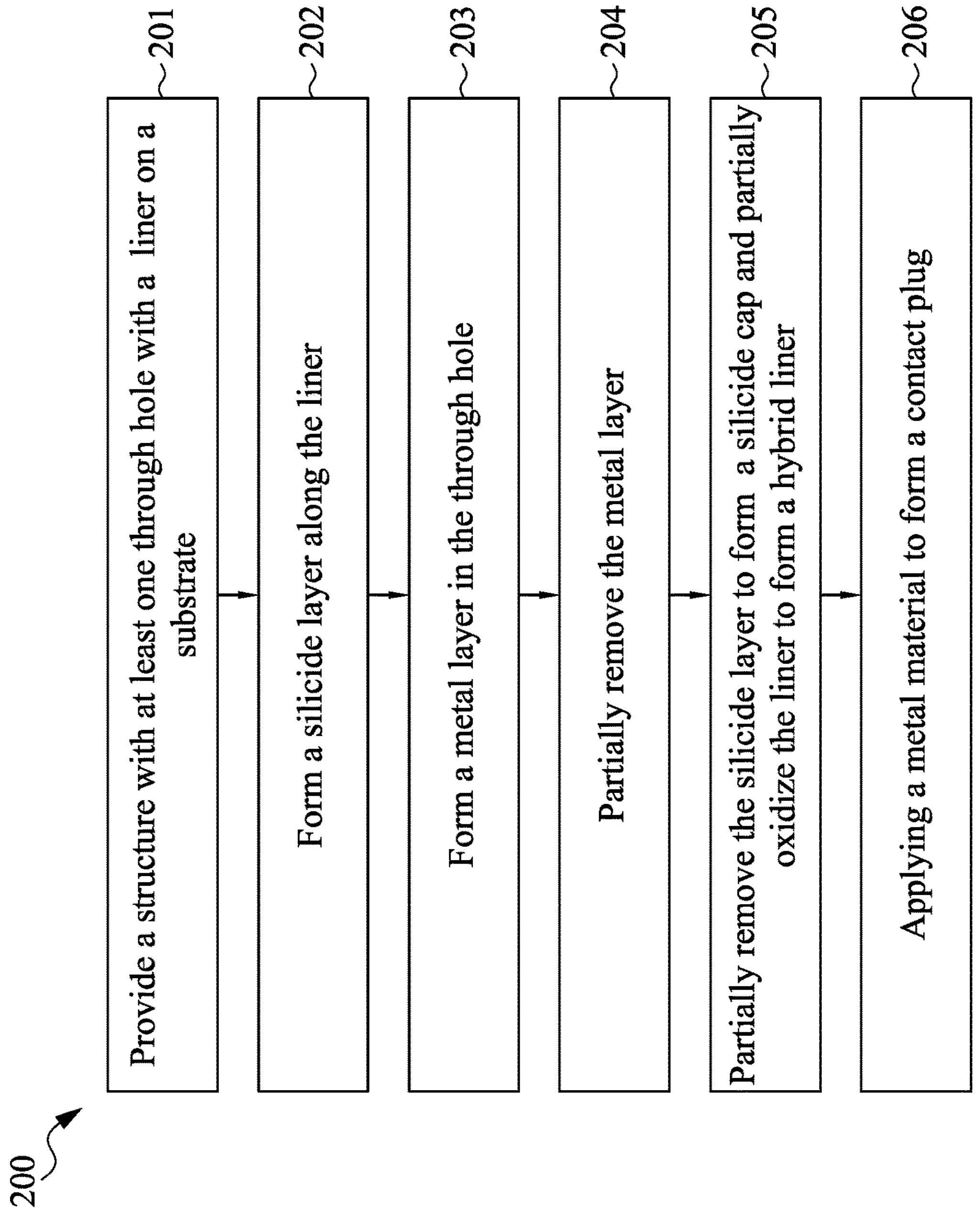
FIG. 3 is a flowchart of a method for forming a semiconductor structure according to various aspects of the present disclosure.

FIG. 3 is a flowchart representing a method 200 for forming a semiconductor structure according to various aspects of the present disclosure. In some embodiments, the method 200 for forming the semiconductor structure includes a number of operations (201, 202, 203, 204, 205 and 206). The method 200 for forming the semiconductor structure will be further described according to one or more embodiments. It should be noted that the operations of the method 200 may be rearranged or otherwise modified within the scope of the various aspects. It should further be noted that additional processes may be provided before, during, and after the method 200, and that some other processes may be only briefly described herein. FIGS. 4A to 4G, 5A to 5G, 6A to 6G and 7A to 7F are diagrammatic cross-sectional side views illustrating various stages in the method 200 for forming the connecting structure according to aspects of one or more embodiments of the present disclosure.

In some embodiments, the semiconductor structure is a field effect transistor such as a fin field effect transistor (FinFET). The FinFET refers to any fin-based, multi-gate transistor. In alternative some embodiments, the field effect transistor may be a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC). In some embodiments, the semiconductor structure is a long channel field effect transistor. In alternative some embodiments, the semiconductor structure is a short channel field effect transistor. In some embodiments, the semiconductor structure is a nanosheet, nanowire or the like.

As shown in FIGS. 4A, 5A, 6A and 7A, method 200 begins at operation 201 by providing or receiving a structure with at least one through hole 300 with a liner 400 on a substrate 110. The structure is provided, in which an epi-layer 120, a first etch stop layer 130, a plurality of interlayer dielectric (ILD) structures 140, a plurality of gate structures 150, a second etch stop layer 170, an inter-metal dielectric layer 180 and a plurality of plugs 182, 184 are formed on the substrate 110 (referring to FIG. 1) or is provided, in which an epi-layer 120, a first etch stop layer 130, a plurality of interlayer dielectric (ILD) structures 140, a plurality of gate structures 150 and a second etch stop layer 170 while an inter-metal dielectric layer 180 and a plurality of plugs 182, 184 are formed after the formation of a hybrid liner 166 (referring to FIG. 2). The through hole 300 is formed by removing materials deposited on the epi-layer 120 by etching processes. In some embodiments, the materials deposited on the epi-layer 120 is a nitride material, such as silicon nitride, so the through hole 300 is formed by partially removing the nitride material to expose the epi-layer 120 and form the liner 400 surrounding the through hole 300.

Referring to FIGS. 4B, 5B, 6B and 7B, the method 200 then proceeds to operation 202 where a silicide layer 500 is formed along the liner 400 and on the epi-layer 120. The silicide layer 500 includes RuSi, CoSi, MoSi, NiSi, PtSi, TaSi, WSi, CrSi, ZrSi and the like.

Figure 4A:
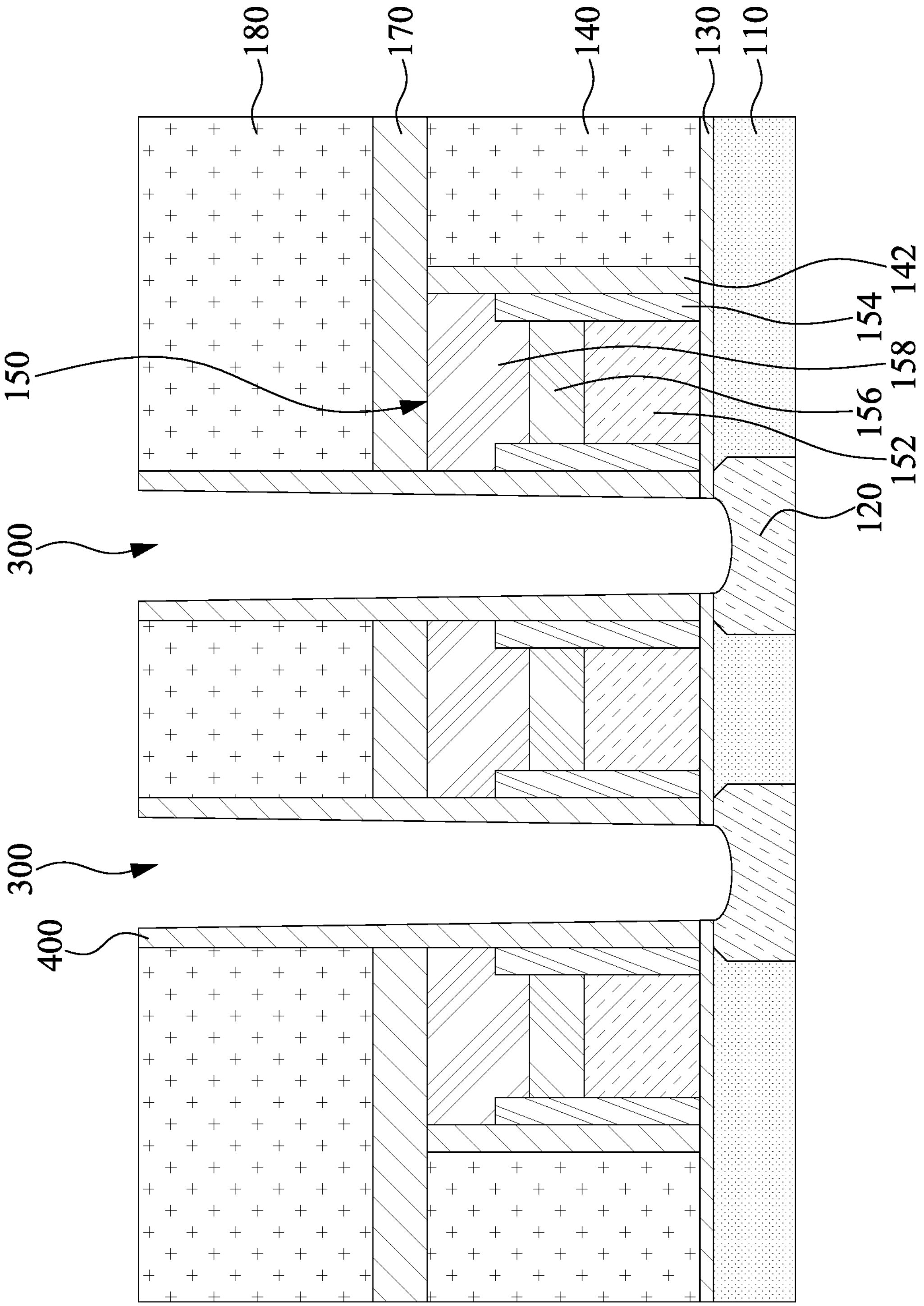
FIGS. 4A to 4G illustrate diagrammatic cross-sectional side views of a semiconductor structure at various stages of fabrication according to some embodiments of the method of FIG. 3.
Figure 4B:
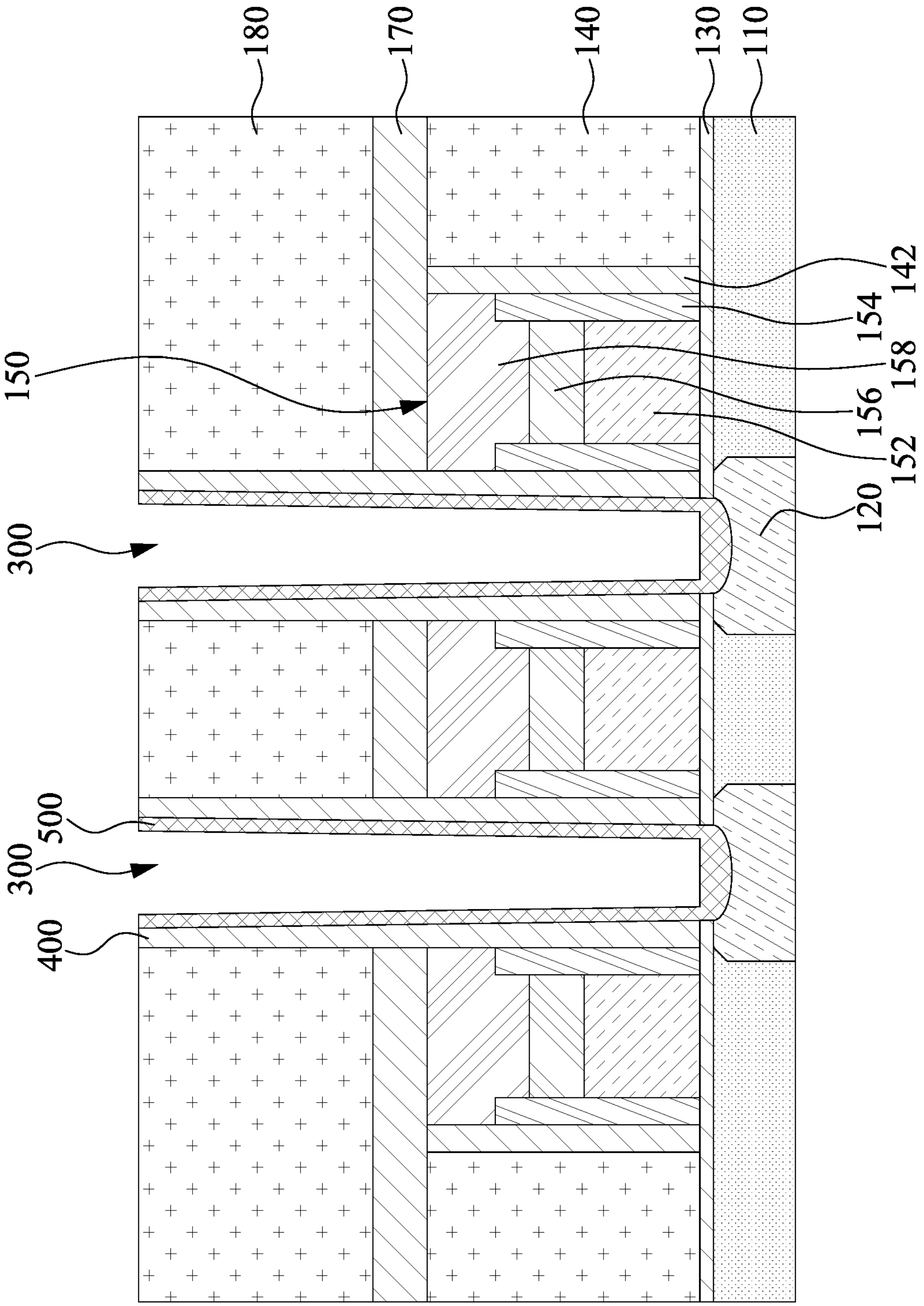
Figure 4C:
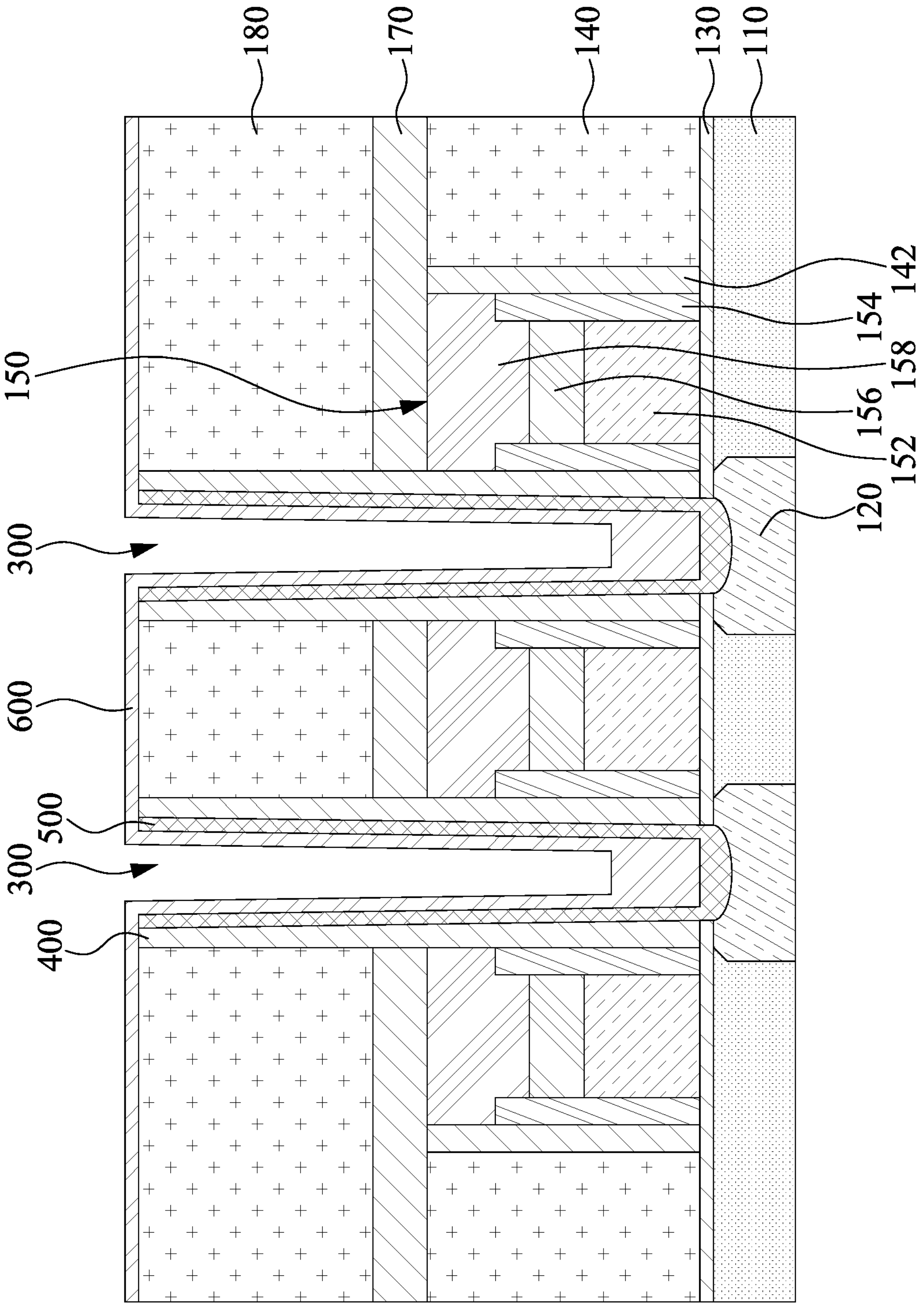
Figure 5A:
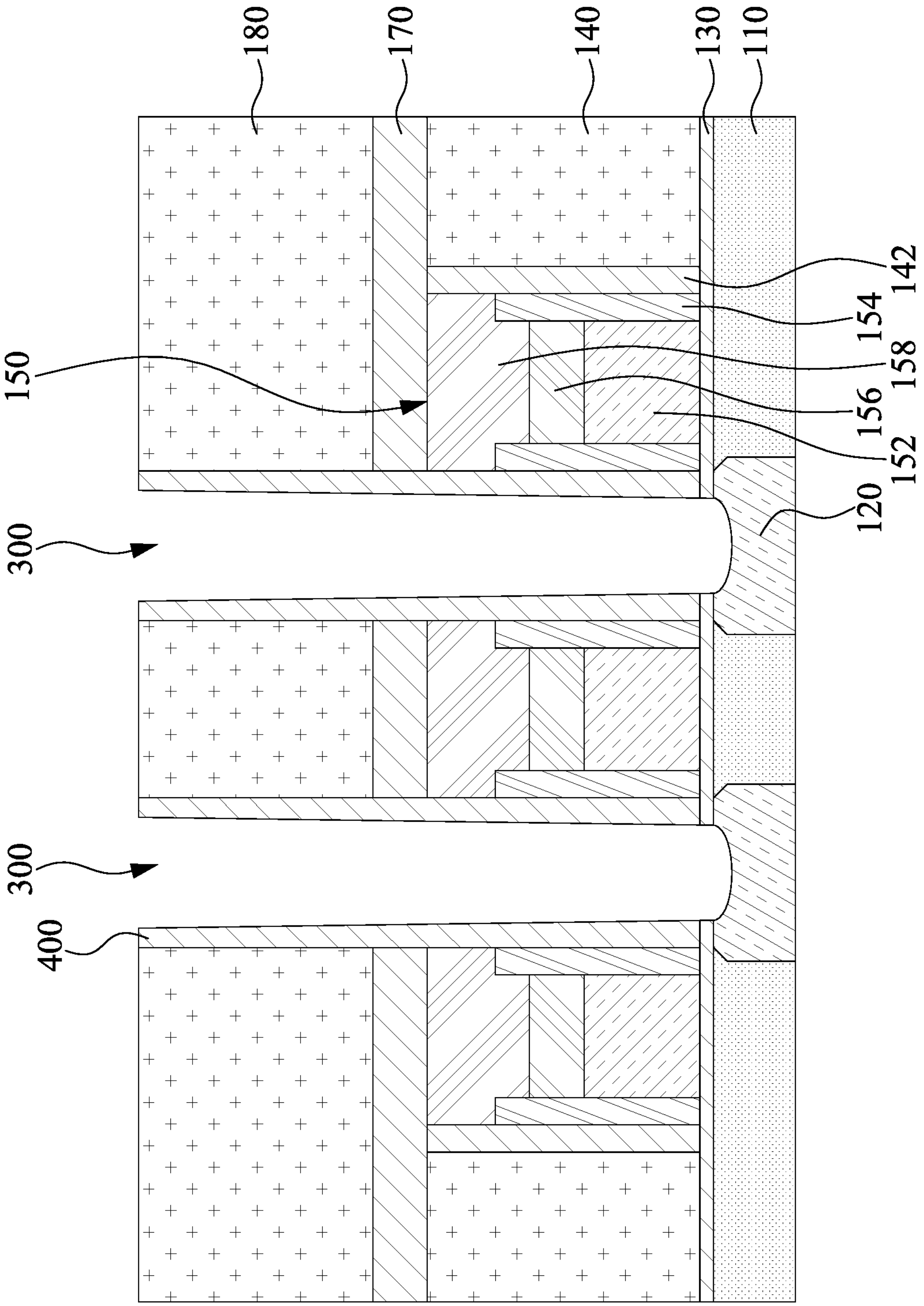
FIGS. 5A to 5F illustrate diagrammatic cross-sectional side views of a semiconductor structure at various stages of fabrication according to some another embodiments of the method of FIG. 3.
Figure 5B:
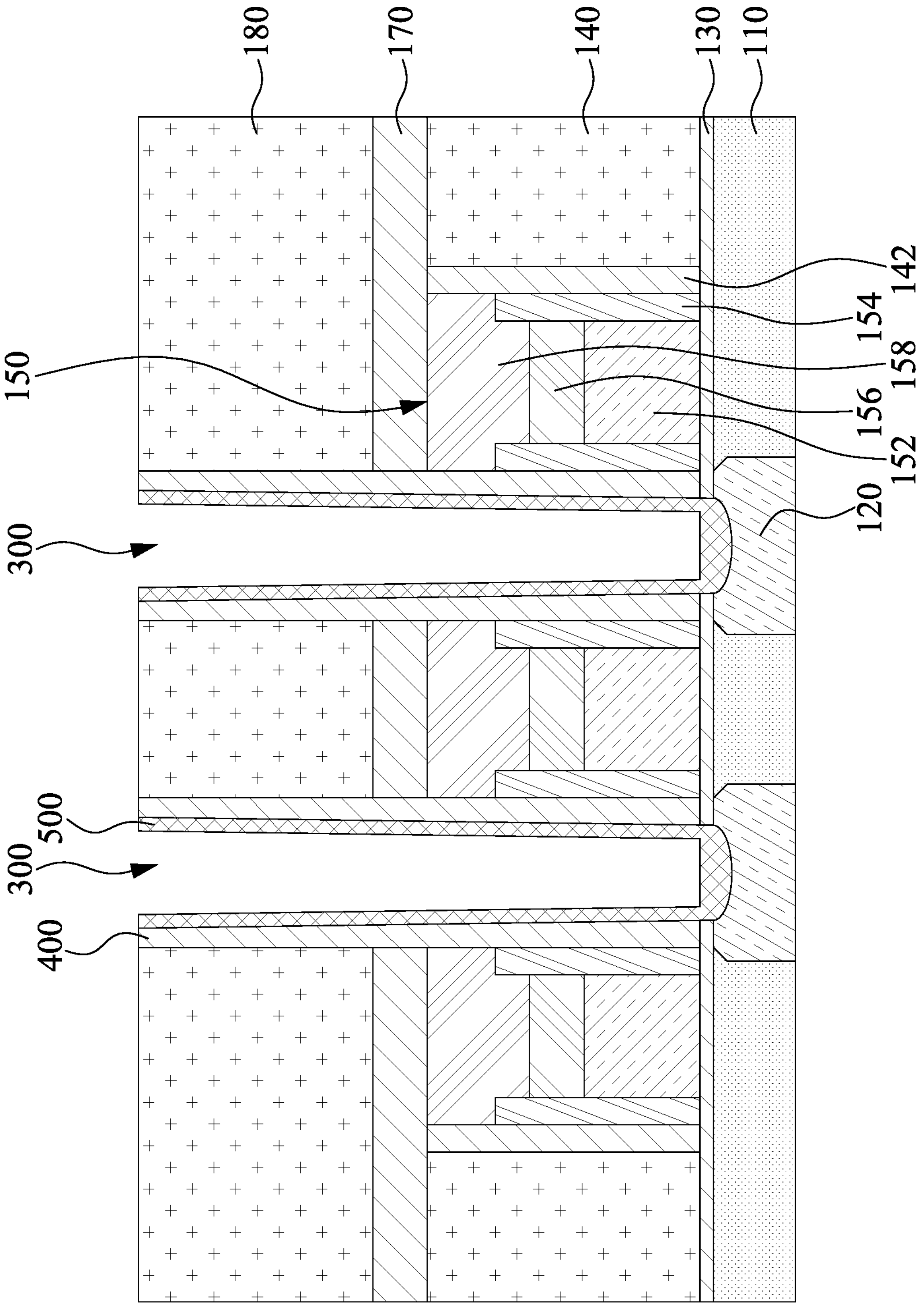
Figure 5C:
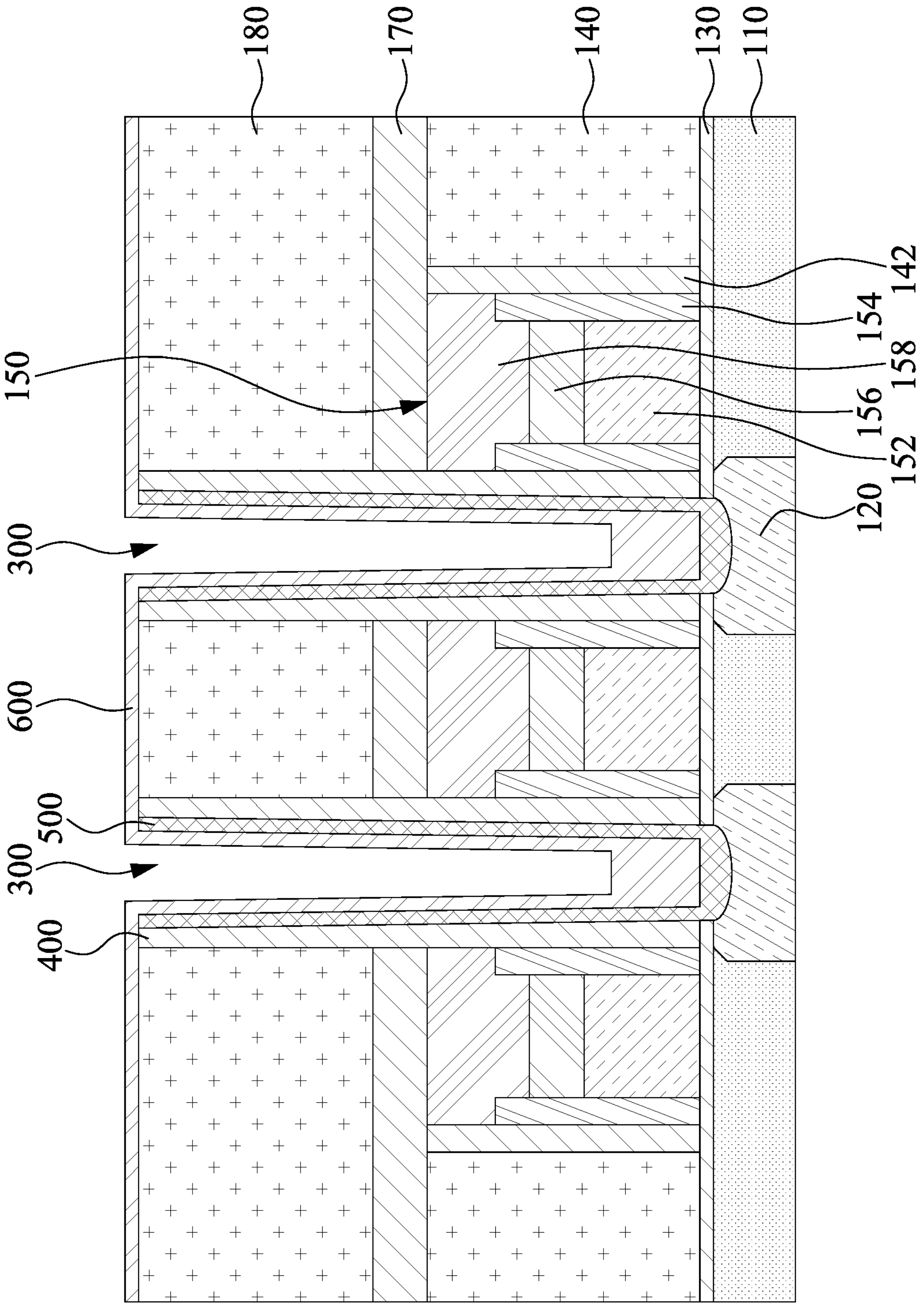
Figure 6A:
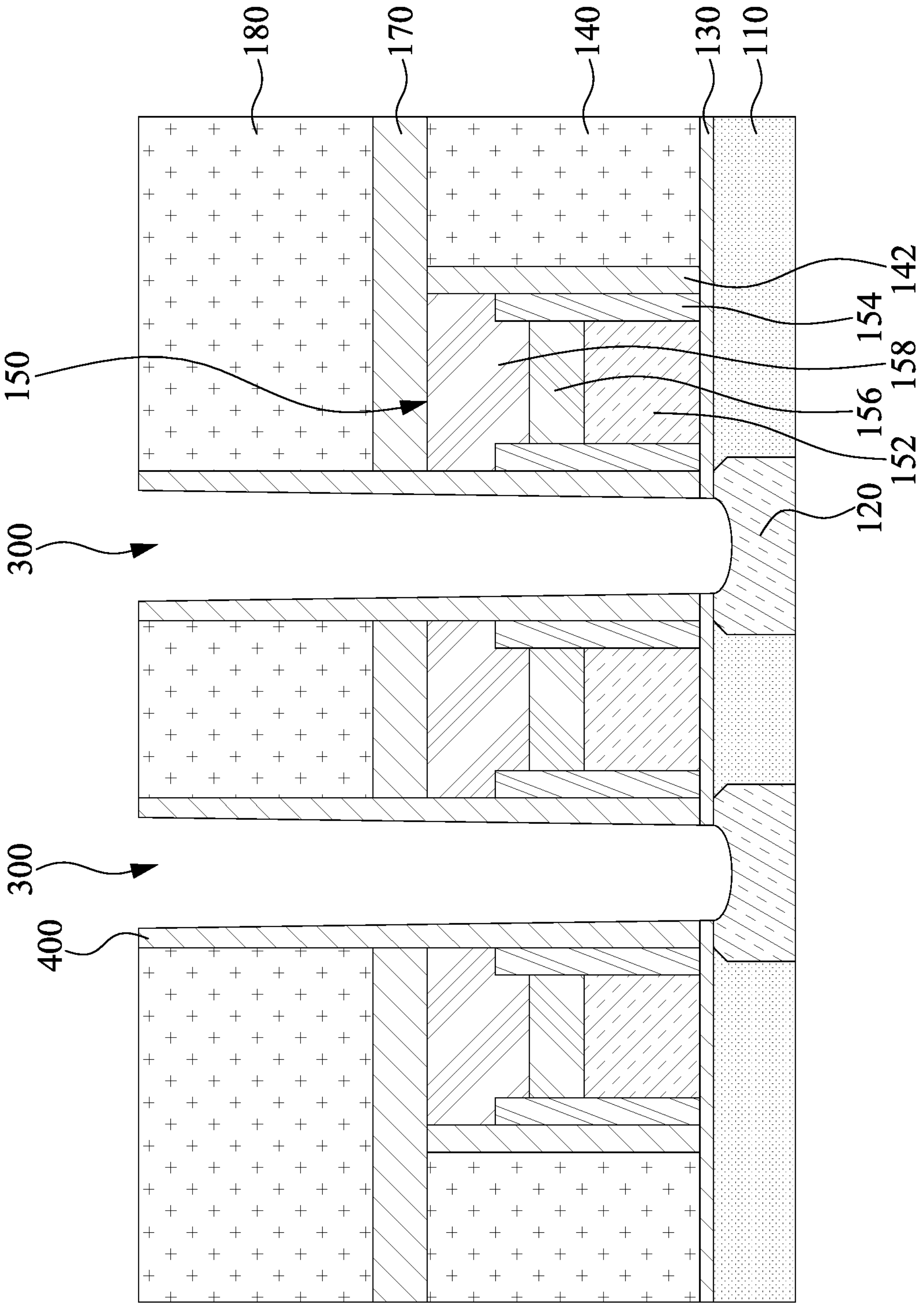
FIGS. 6A to 6G illustrate diagrammatic cross-sectional side views of a semiconductor structure at various stages of fabrication according to some another embodiments of the method of FIG. 3.
Figure 6B:
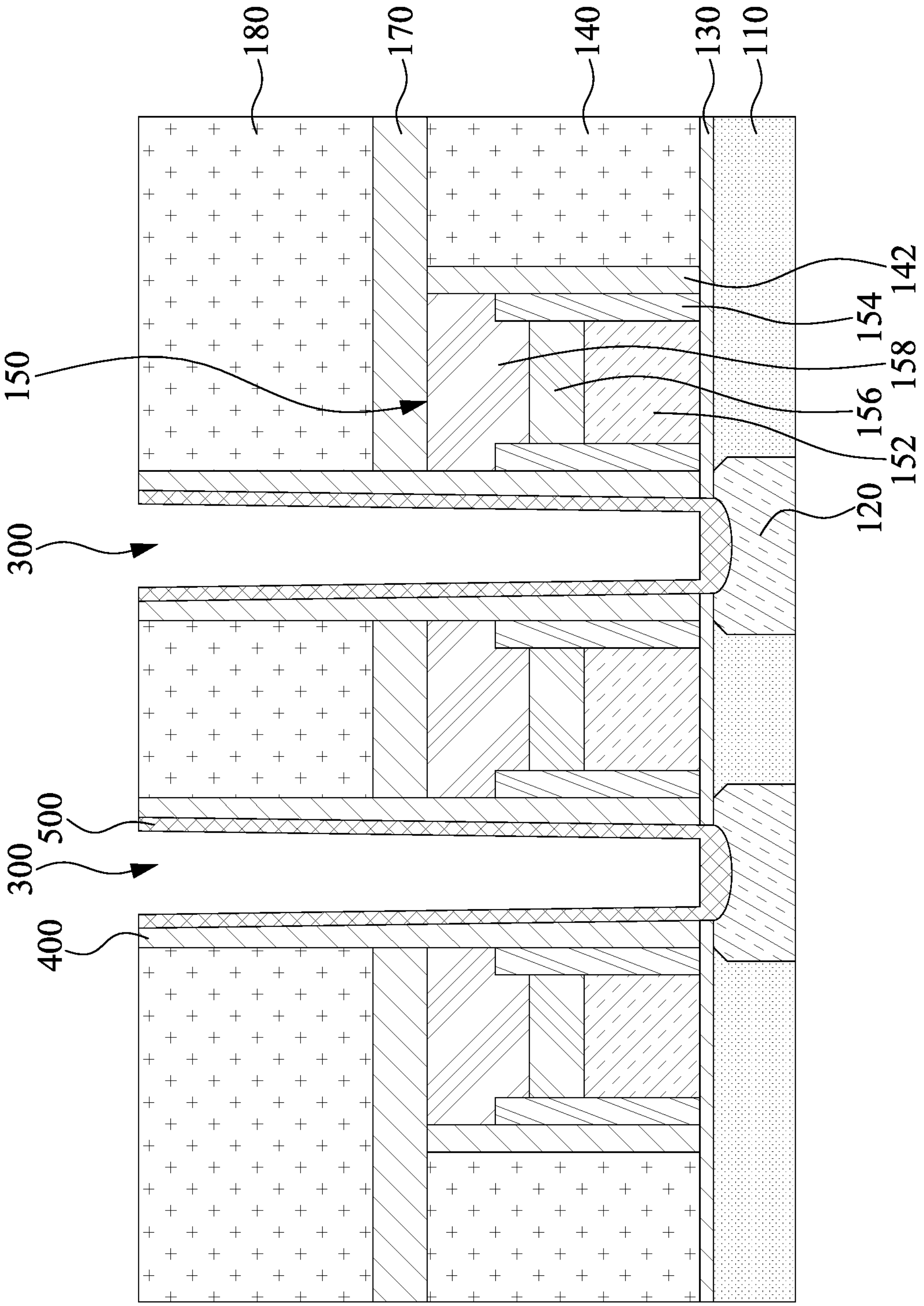
Figure 6C:
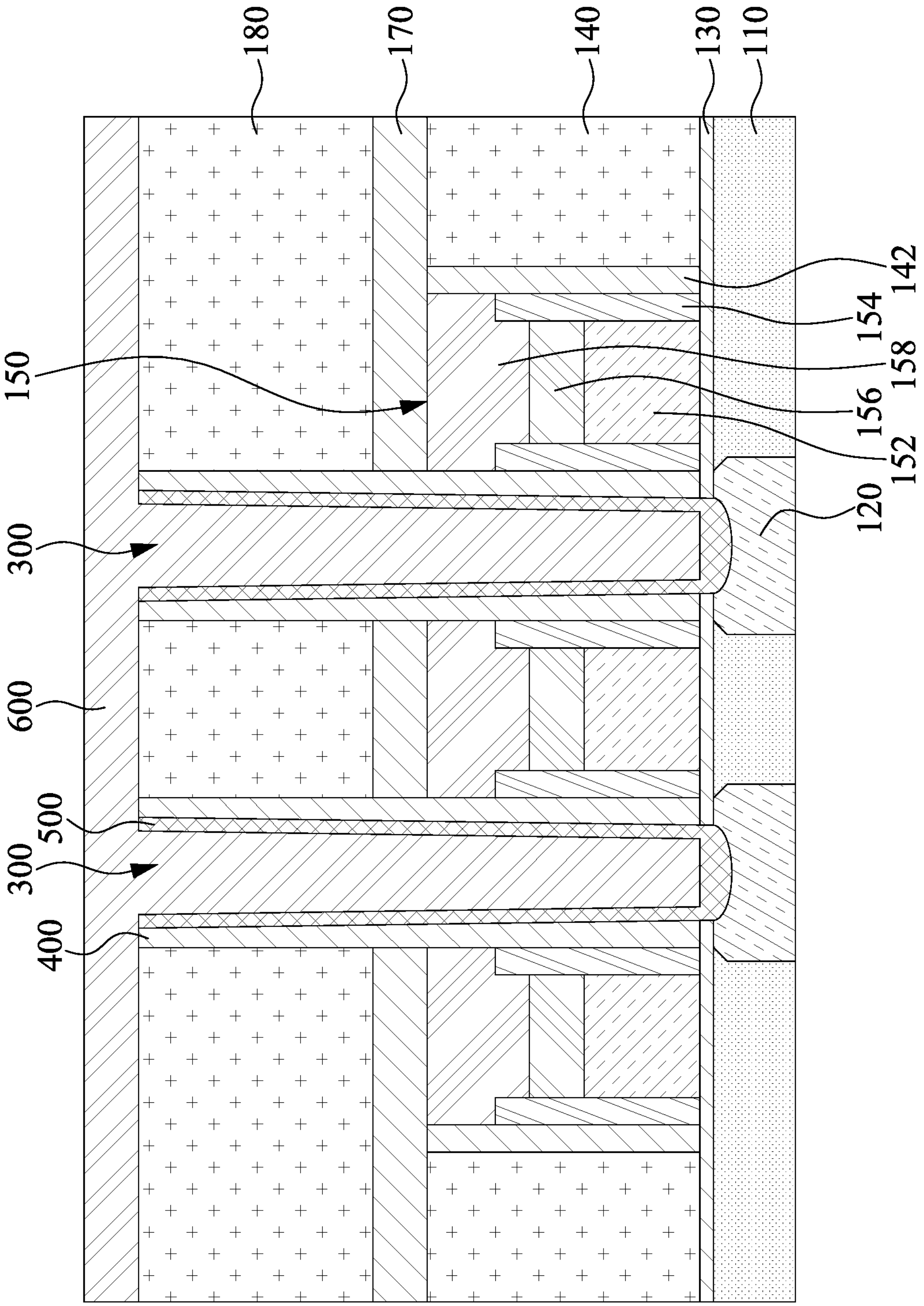
Figure 7A:
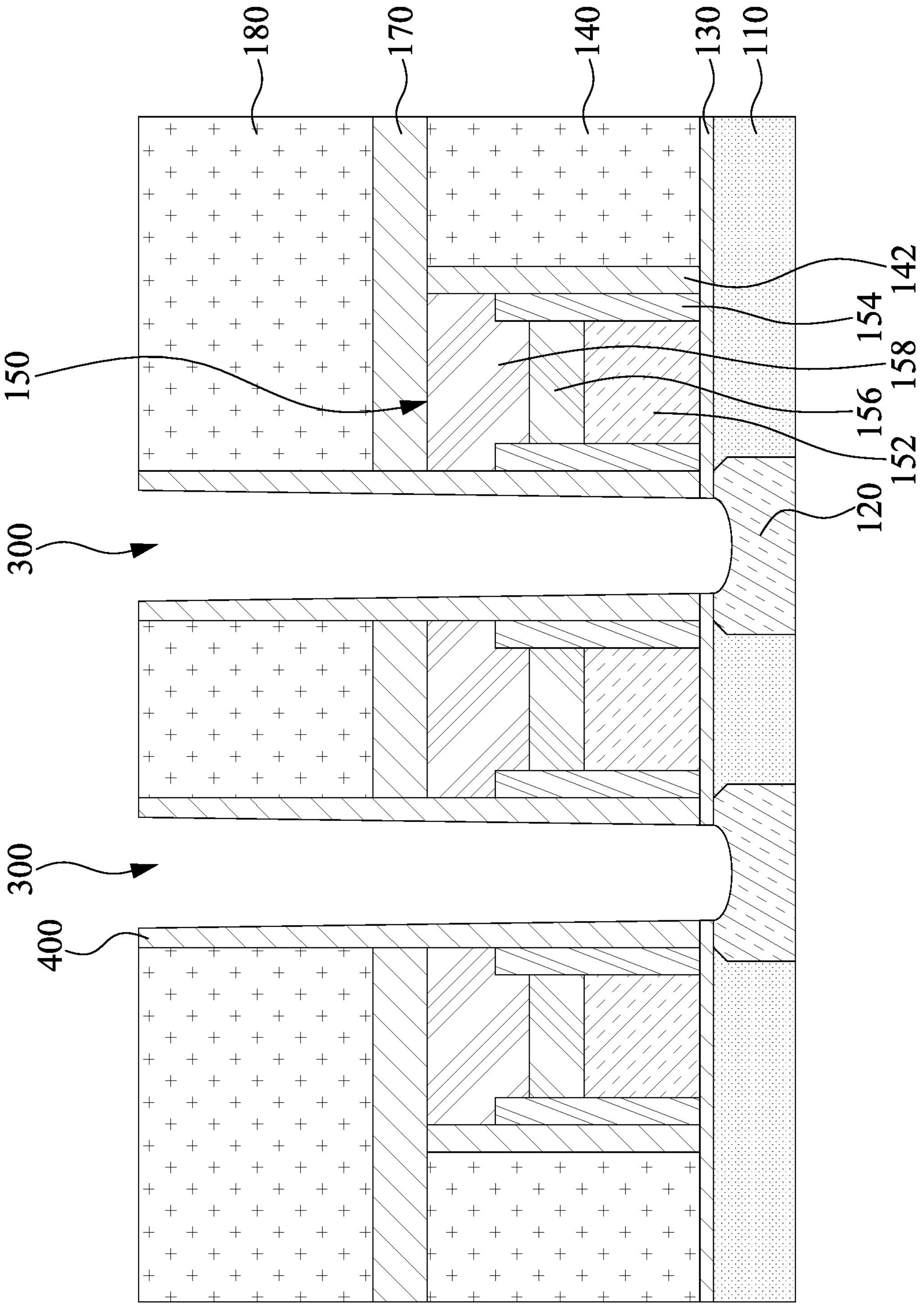
FIGS. 7A to 7F illustrate diagrammatic cross-sectional side views of a semiconductor structure at various stages of fabrication according to some another embodiments of the method of FIG. 3.
Figure 7B:
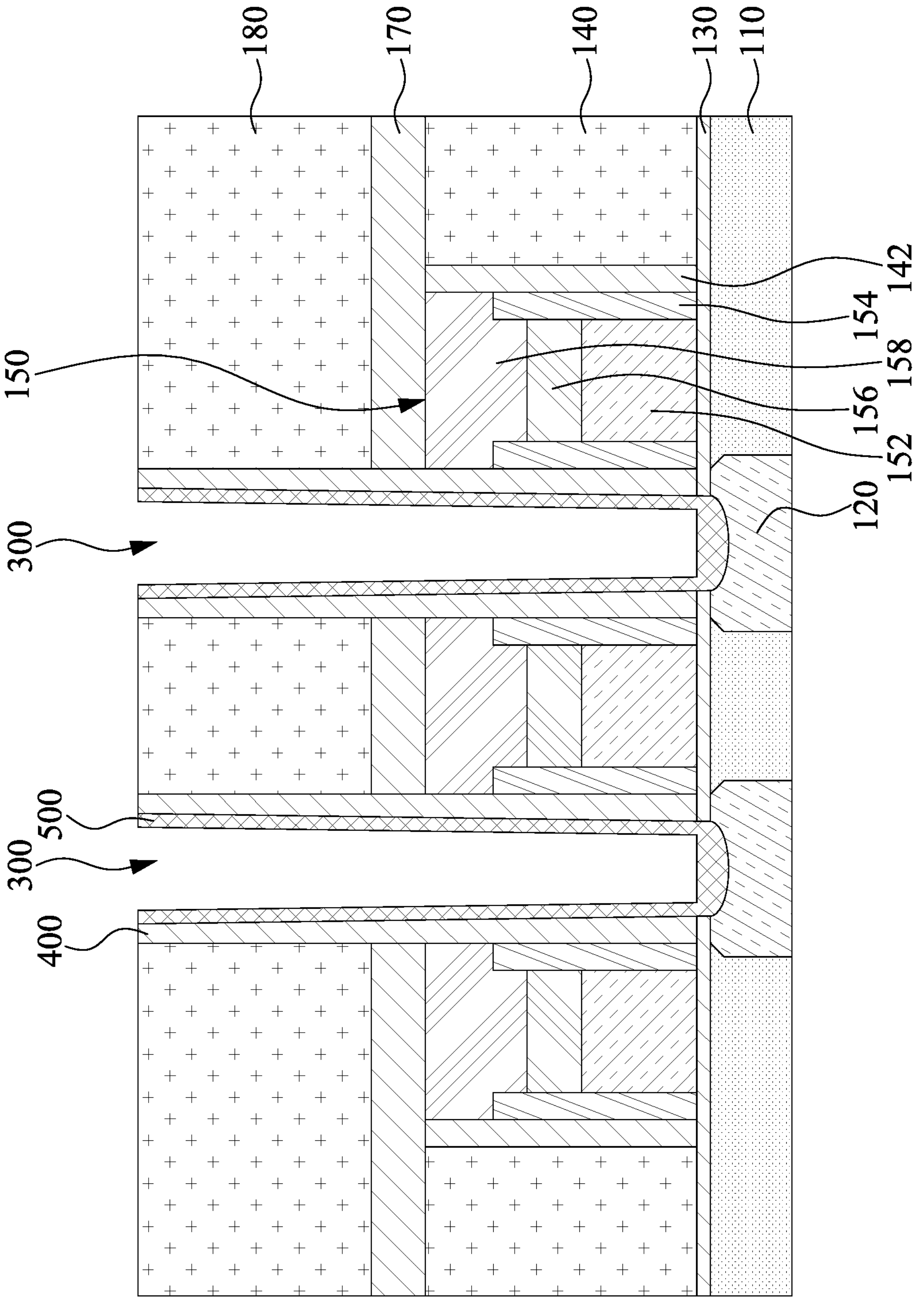
Figure 7C:
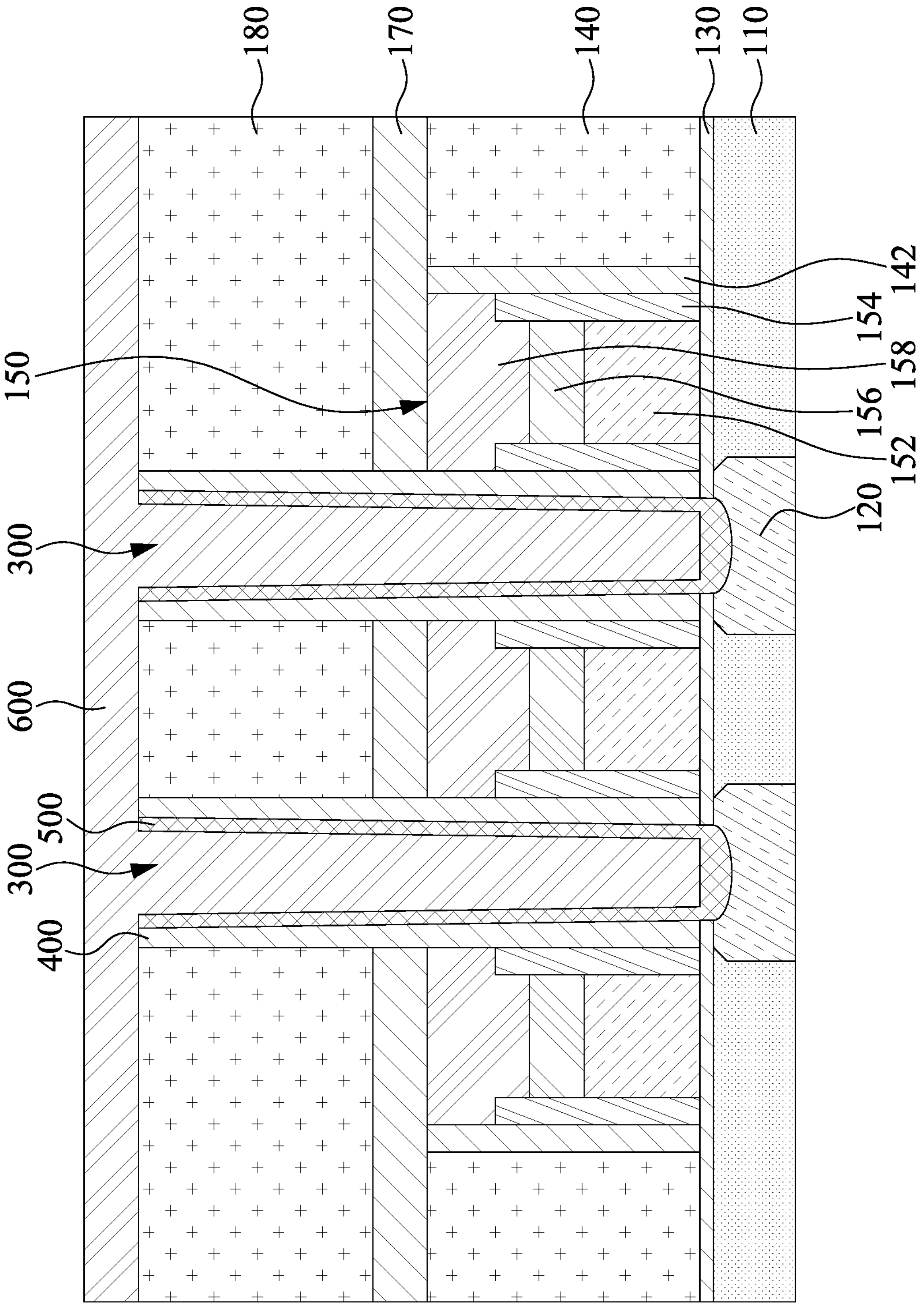

At operation 203, as shown in FIGS. 4C, 5C, 6C and 7C, a metal layer 600 is formed in the through hole 300. In some embodiments, as shown in FIGS. 4C and 5C, the metal layer 600 is formed along the silicide layer 500 and overlaid an upper surface of the inter-metal dielectric layer 180. In some alternative embodiments, as shown in FIGS. 6C and 7C, the metal layer 600 is formed in the through hole 300 and overlaid an upper surface of the inter-metal dielectric layer 180.

Figure 4D:
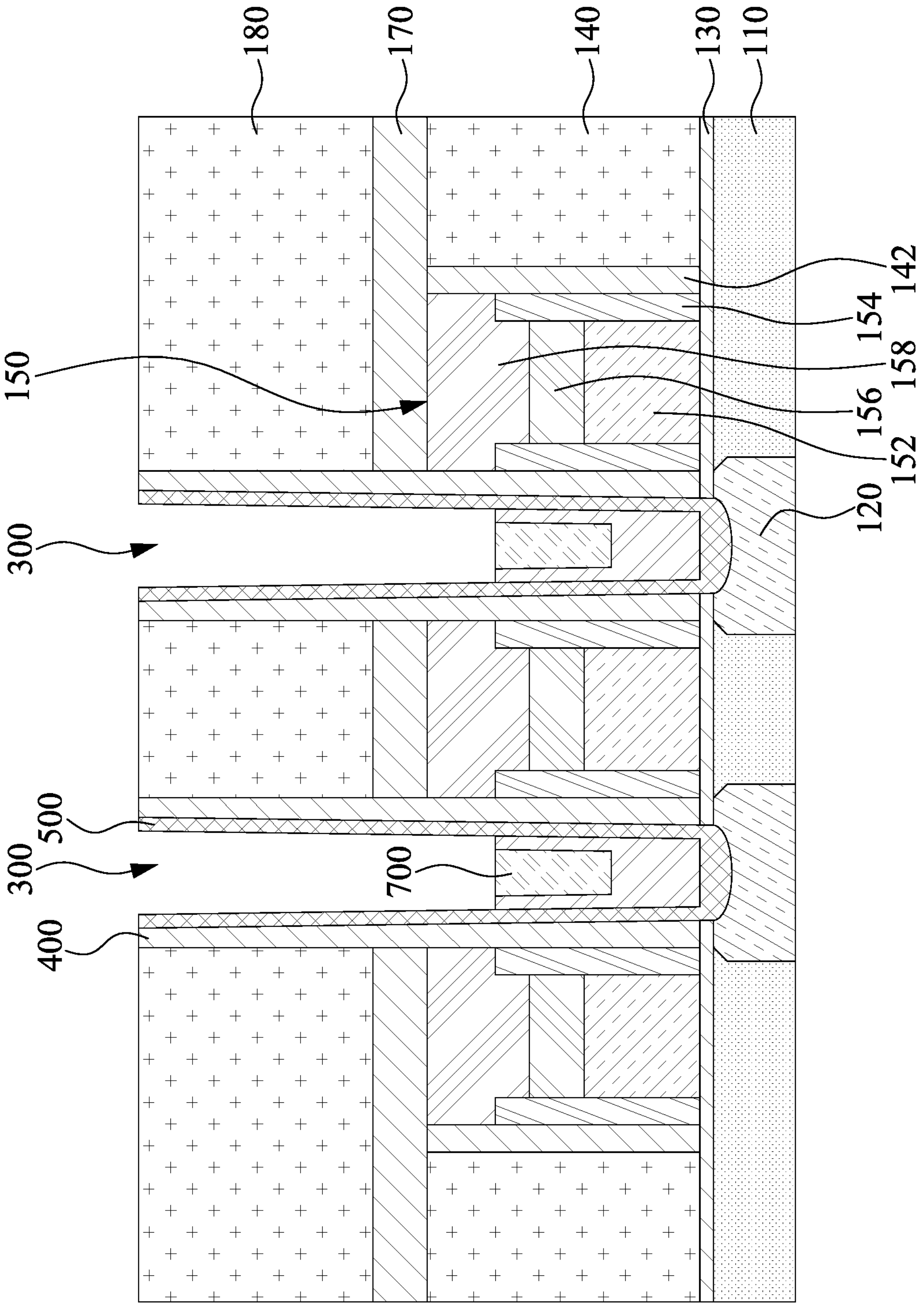
Figure 5D:
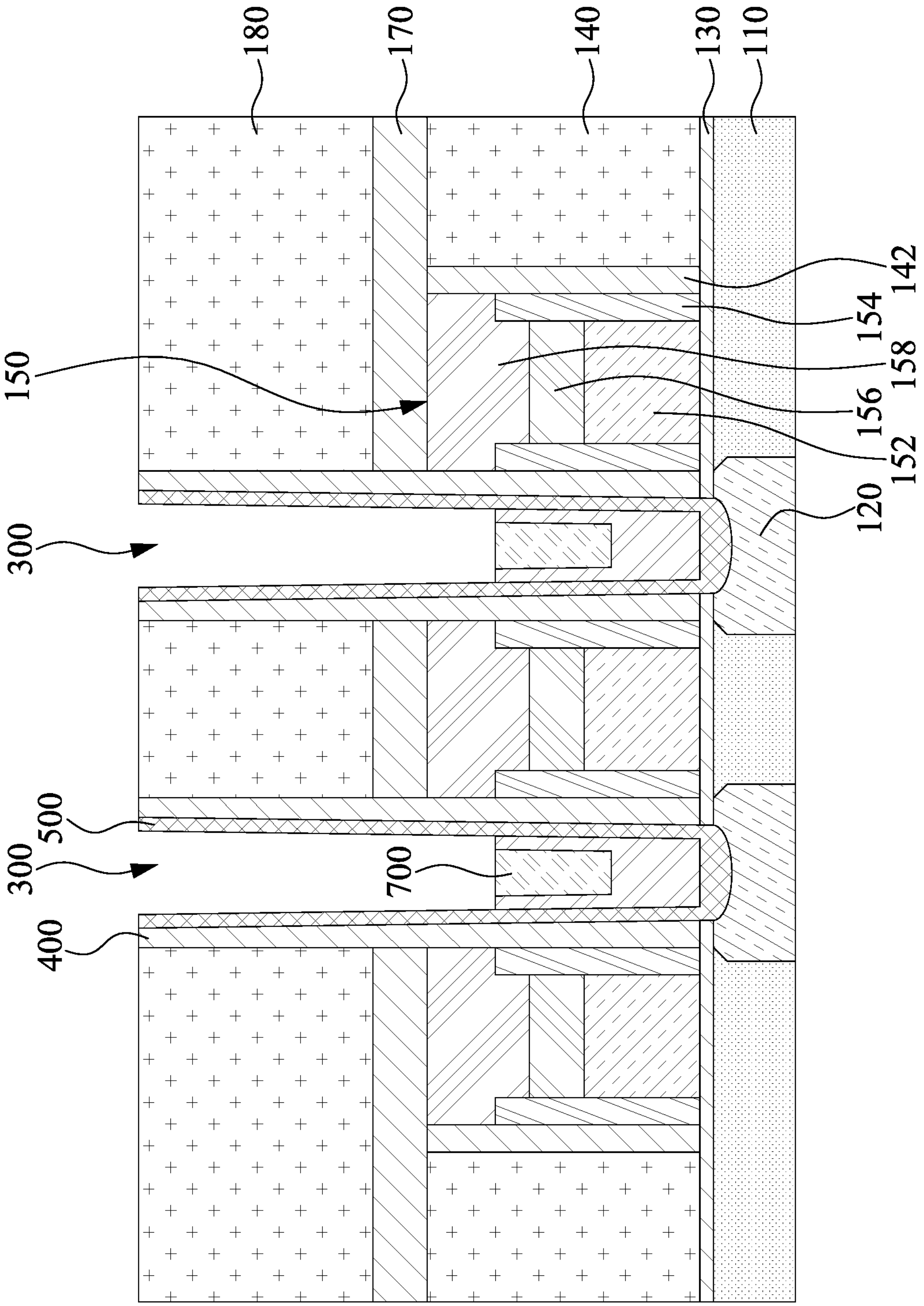
Figure 6D:
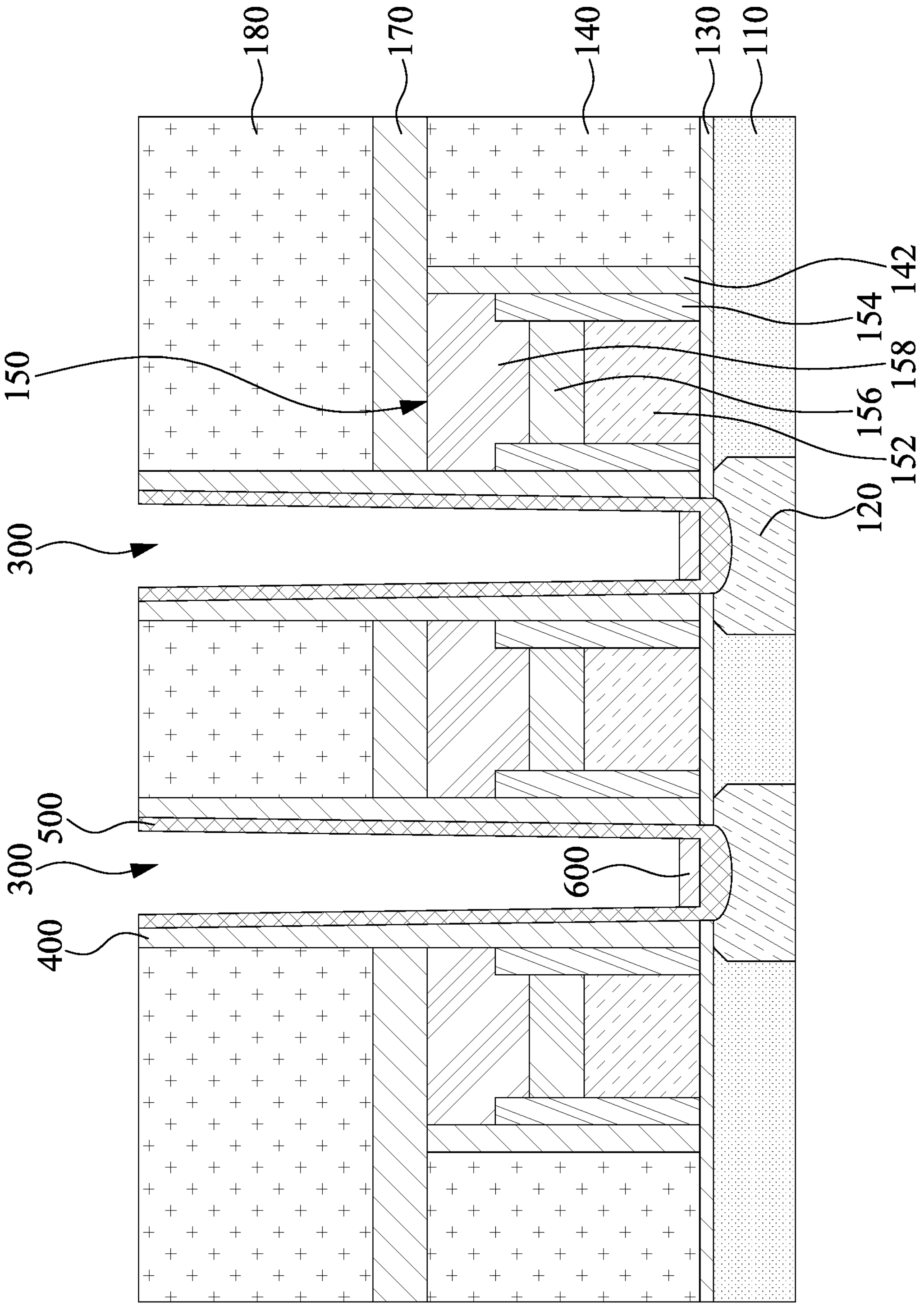
Figure 7D:
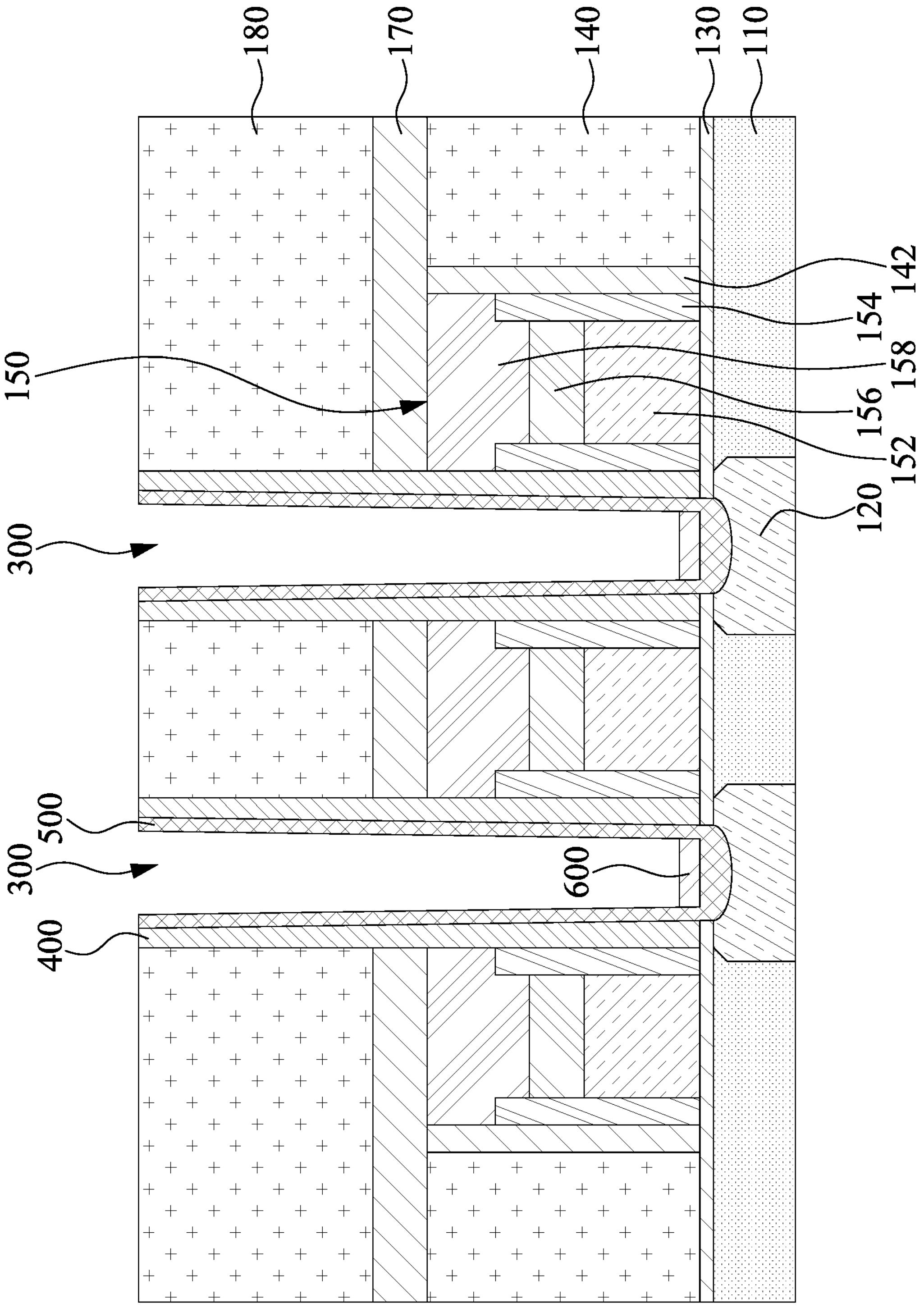

At operation 204, the metal layer 600 is partially removed. In some embodiments as shown in FIGS. 4D and 5D, an upper portion of the metal layer 600 is removed to leave a lower portion of the metal layer 600, which has a U-shape cross section so as to identify a height of a cap wall 1624 of the silicide cap 162 to be formed; and a photoresist 700 is applied to cover or partially cover the lower portion of the metal layer 600. In some another embodiments as shown in FIGS. 6D and 7D, an upper portion of the metal layer 600 is removed to leave an lower portion of the metal layer 600 to identify a height of a cap wall 1624 of the silicide cap 162 to be formed. In some embodiments, the upper portion of the metal layer 600 is removed by wet etching or dry etching.

As shown in FIGS. 4E, 4F, 5E, 6E, 6F and 7E, the method 200 continues with operation 205 where the silicide layer

Figure 4E:
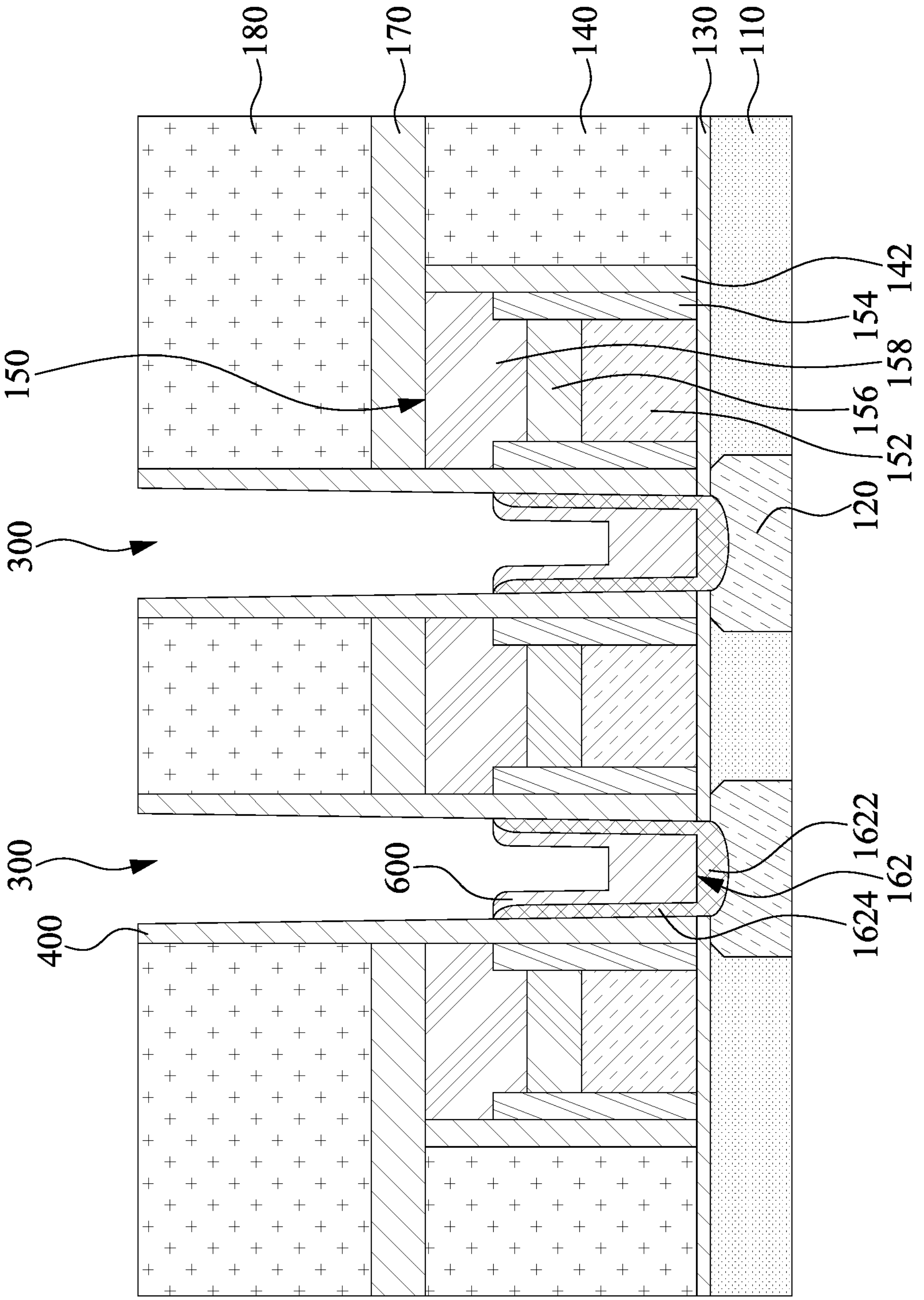
Figure 4F:
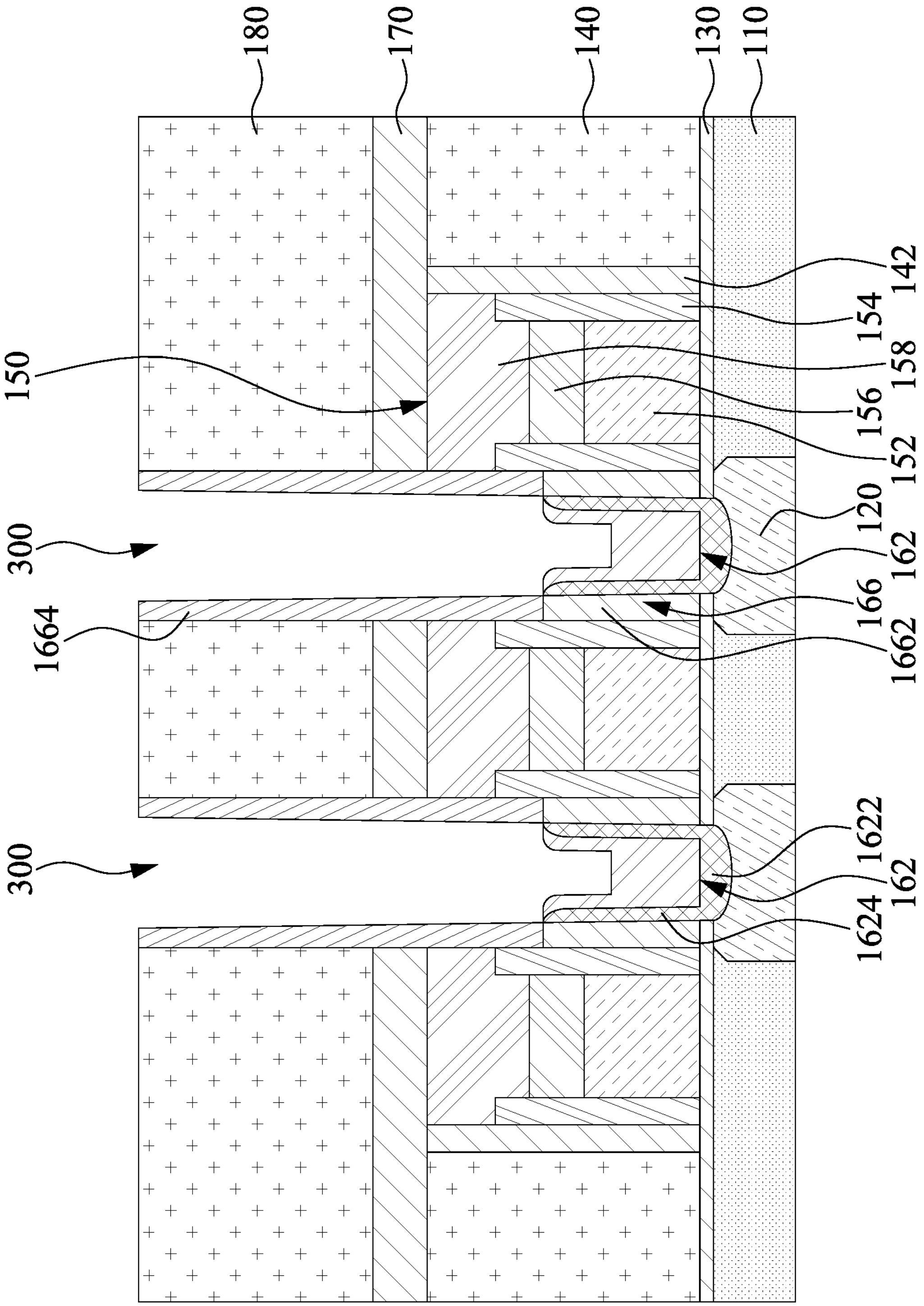
Figure 4G:
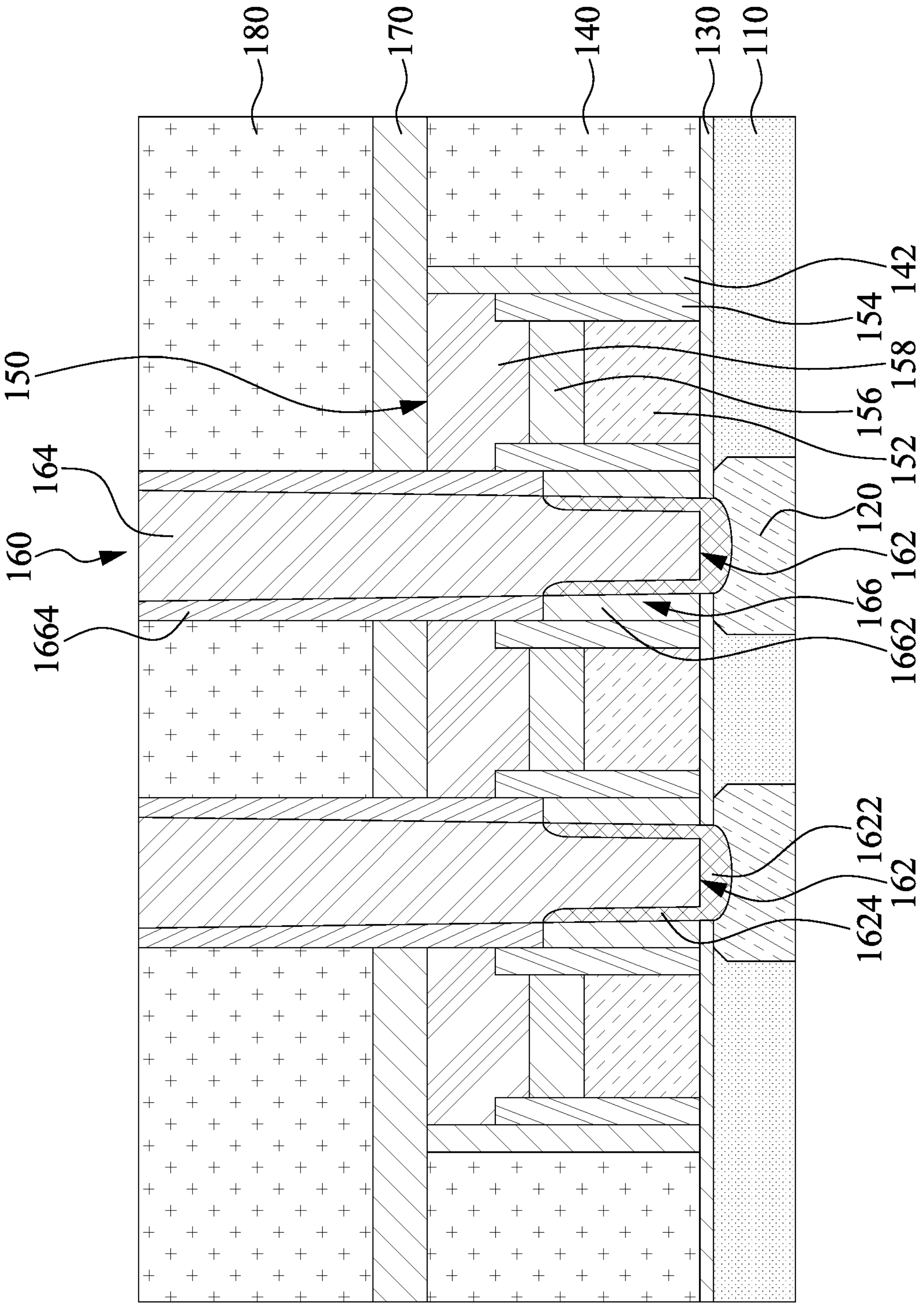
Figure 6E:
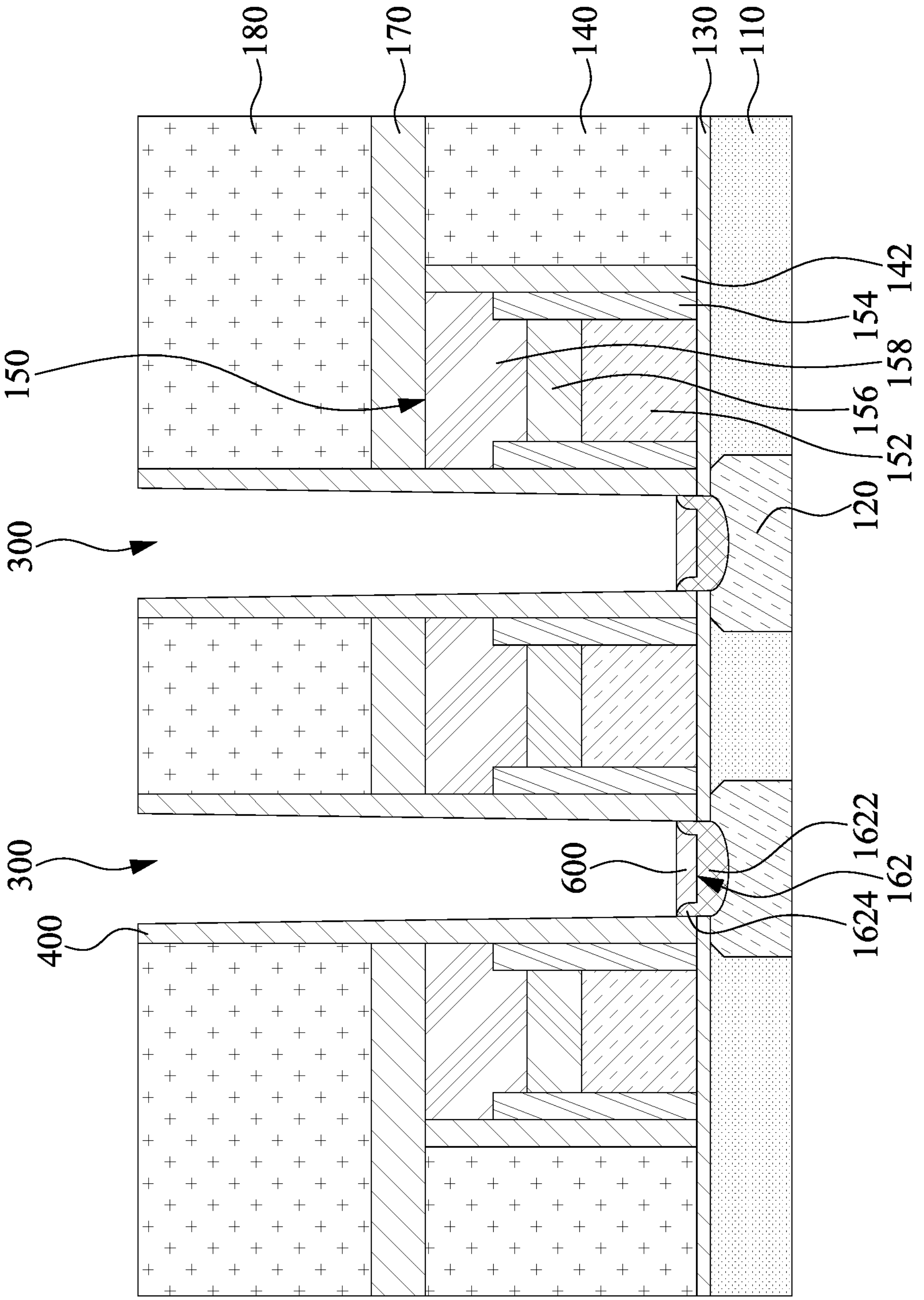
Figure 6F:
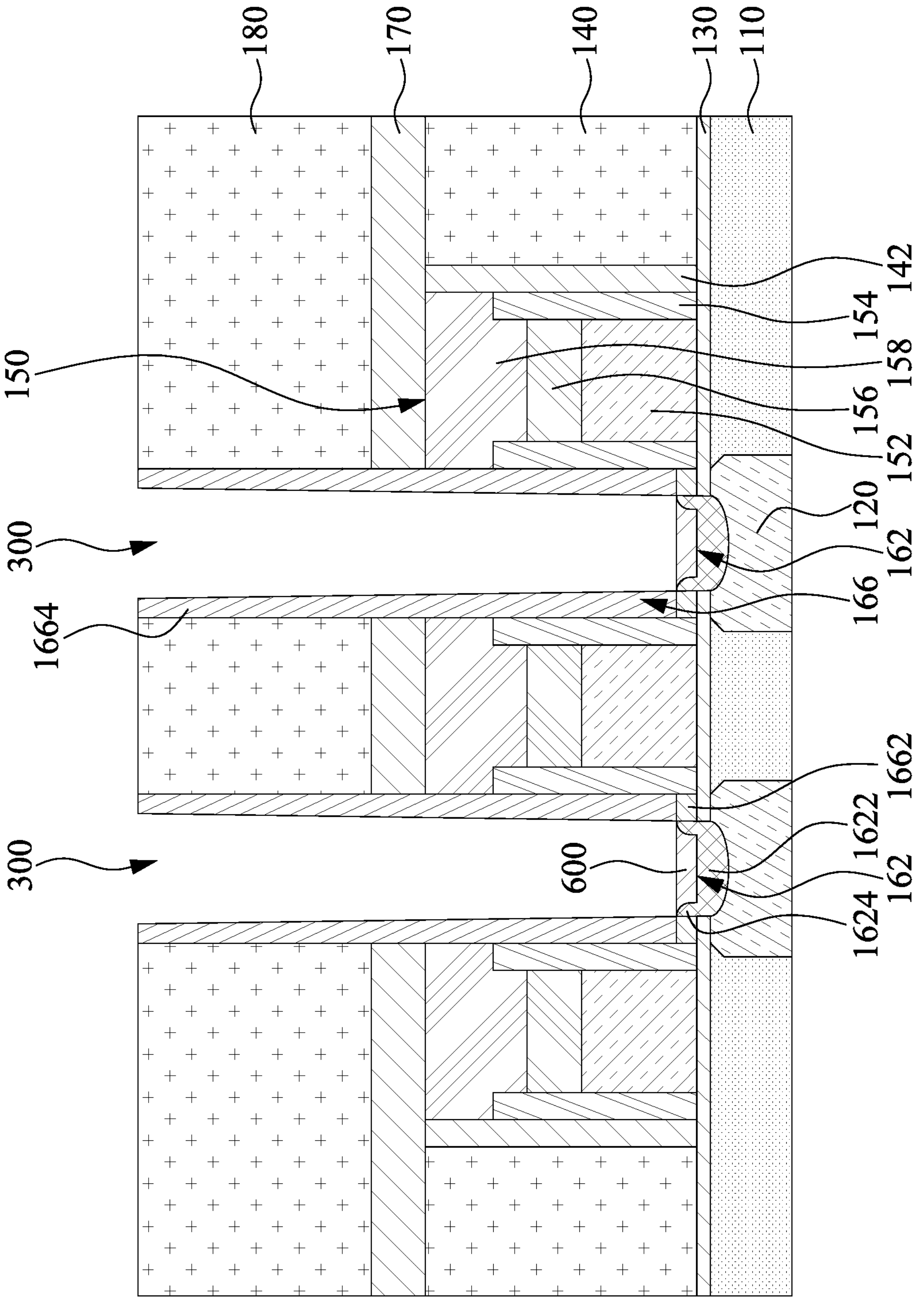
Figure 6G:
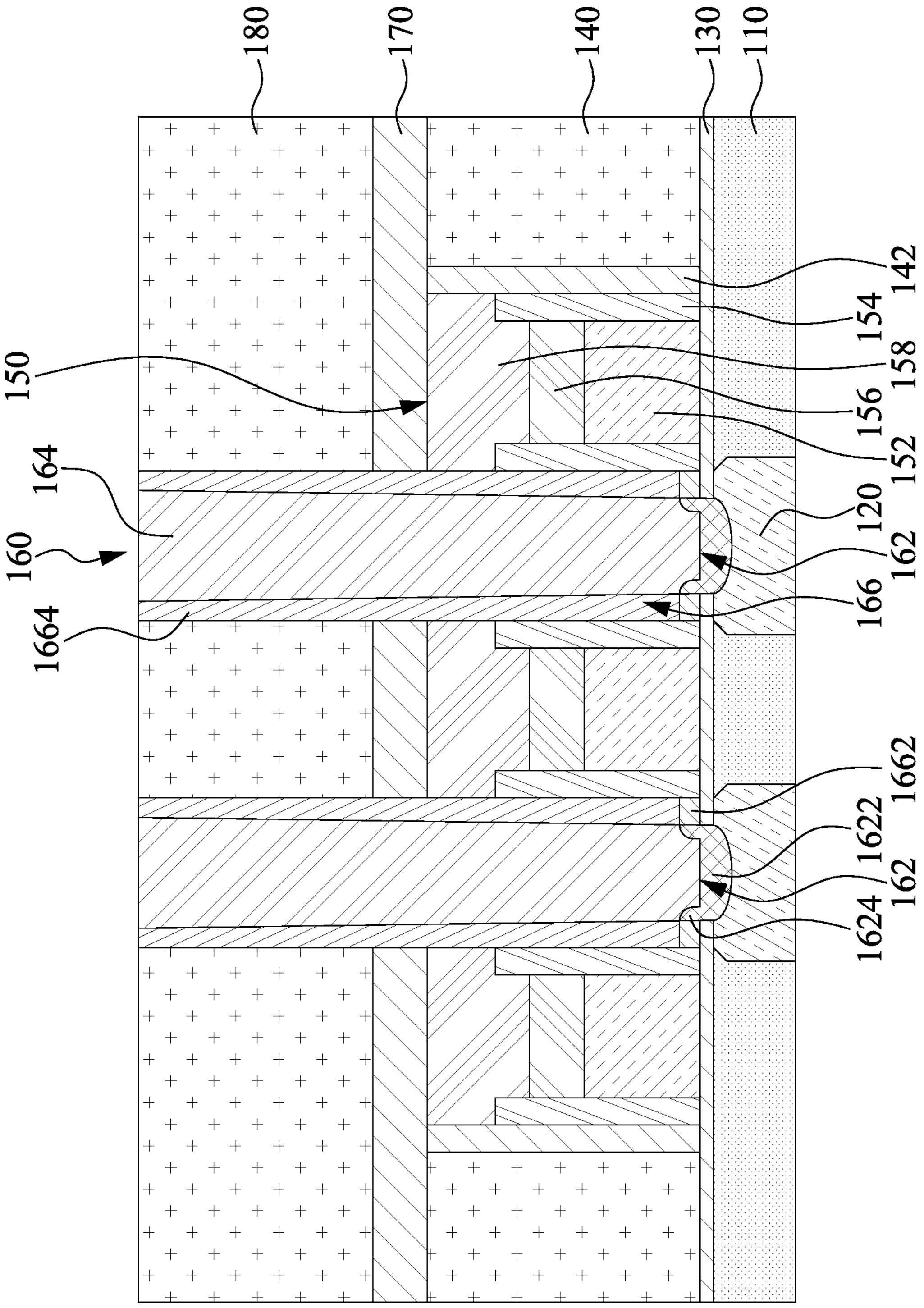

500 is partially removed to form a silicide cap 162 and the liner is partially oxidized to form a hybrid liner. Referring to FIGS. 4E and 6E, in some embodiments, the silicide layer 500 is partially removed to expose an upper portion of the liner 400 so that the portion of the silicide layer 500 abutting the metal layer 600 is retained and serves as the silicide cap 162. The silicide cap 162 has a cap body 1622 disposed on the epi-layer 120 and a cap wall 1624 abutting a sidewall of the metal layer 600. Further referring to FIGS. 4F and 6F, the upper portion of the liner 400 exposed after the silicide layer 500 is partially removed is oxidized to form the hybrid liner 166, so that the hybrid liner 166 includes a lower portion 1662 that is made of nitride and an upper portion 1664 that is made of oxidized nitride.

Figure 5E:
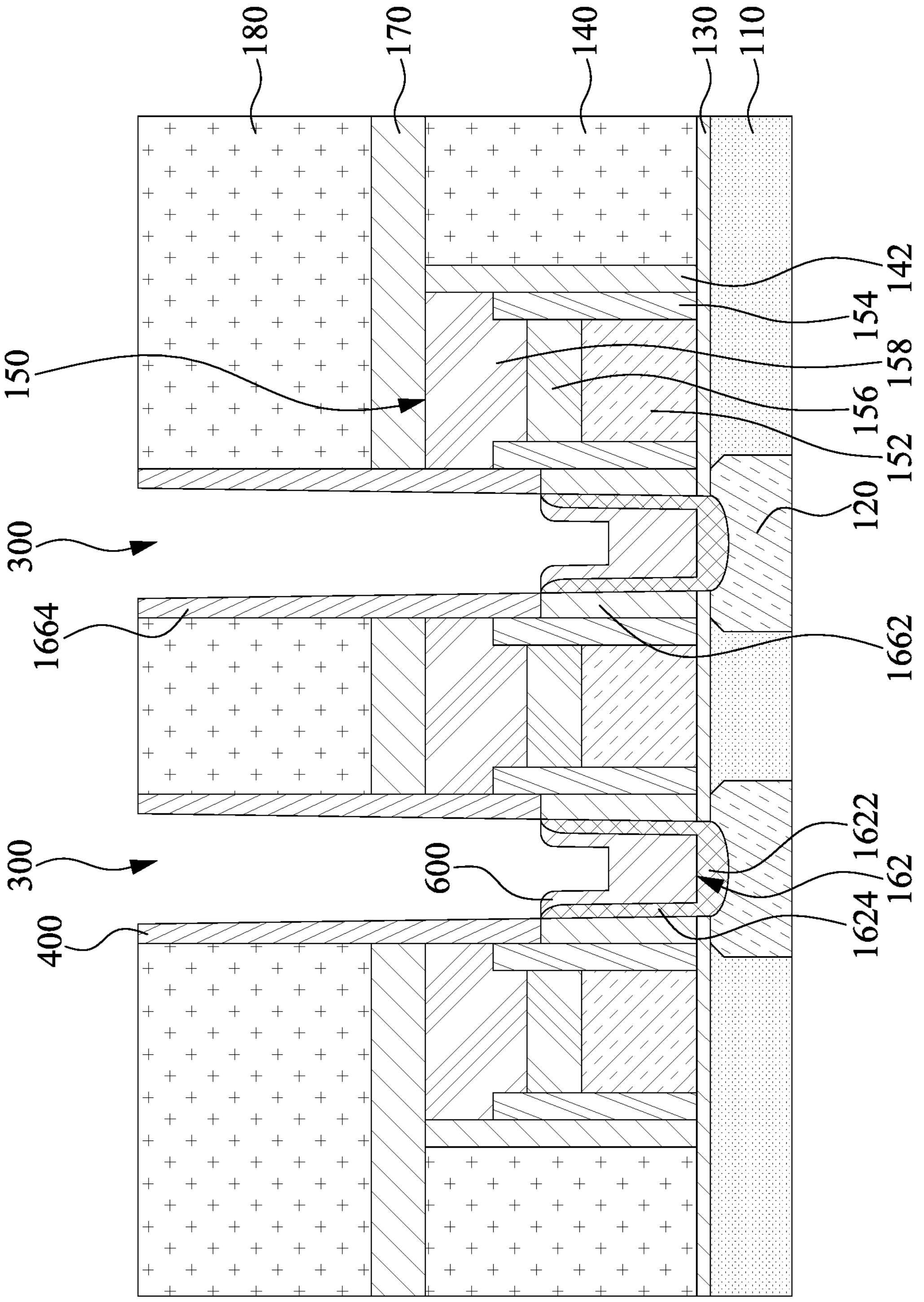
Figure 5F:
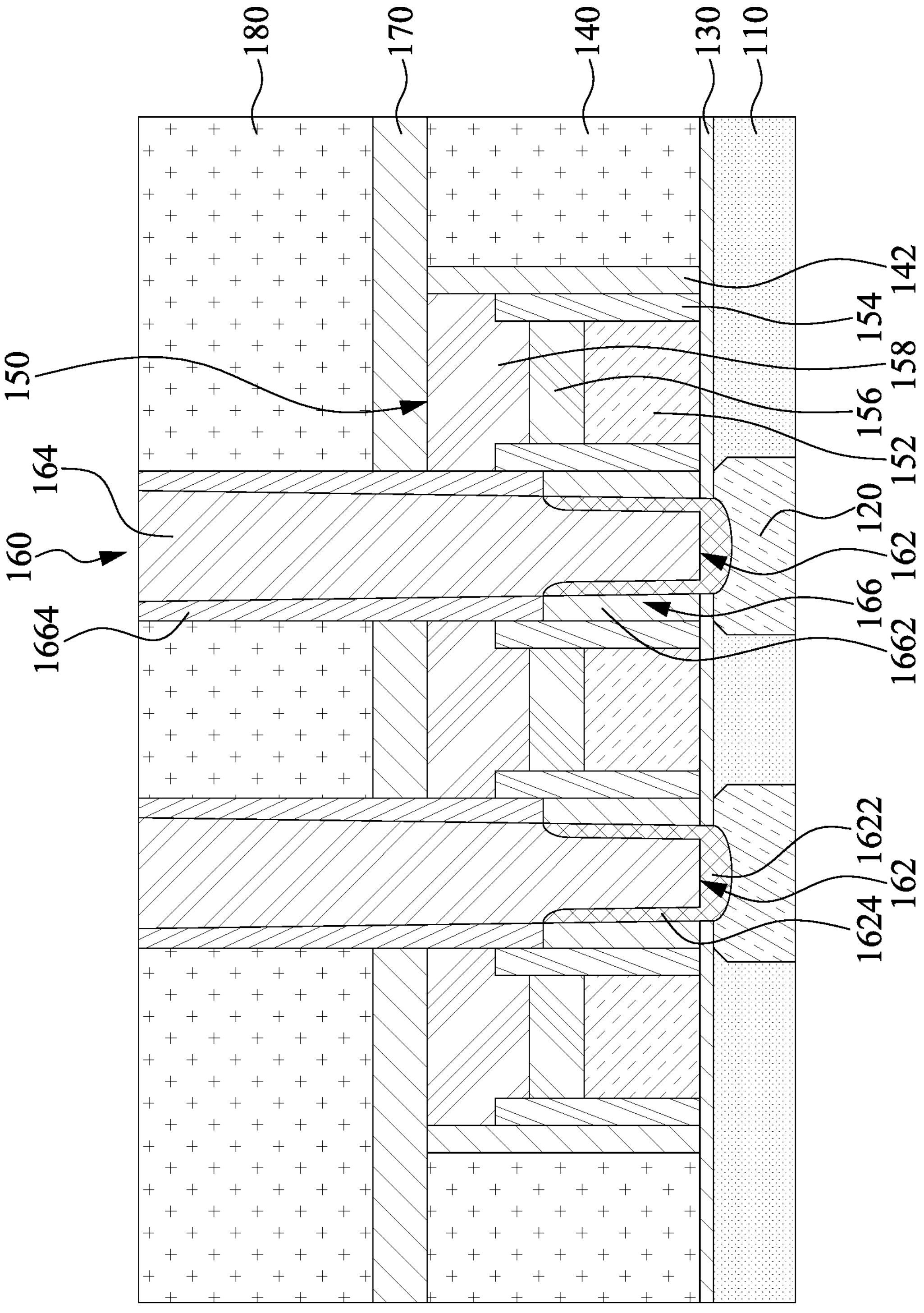
Figure 7E:
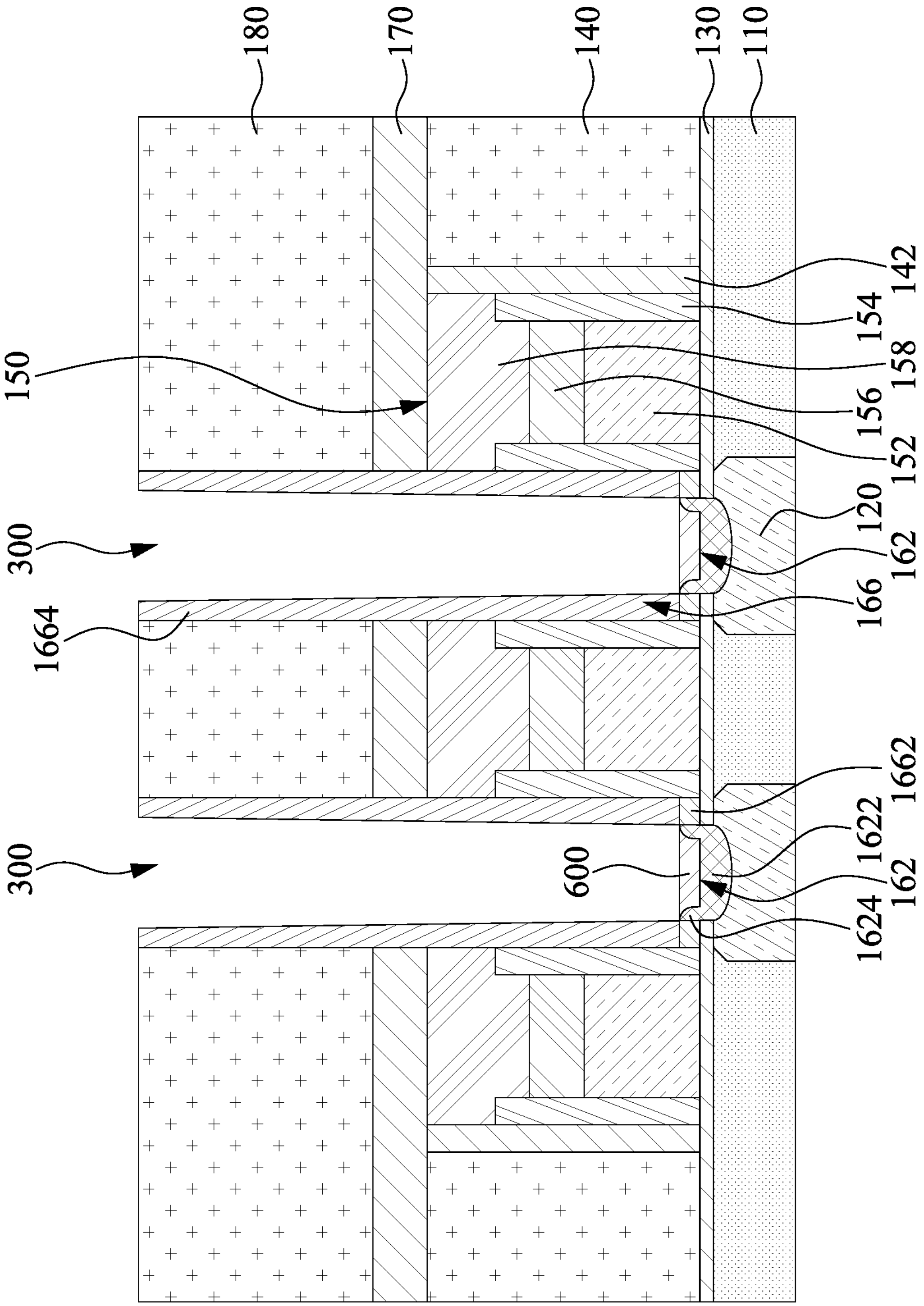
Figure 7F:
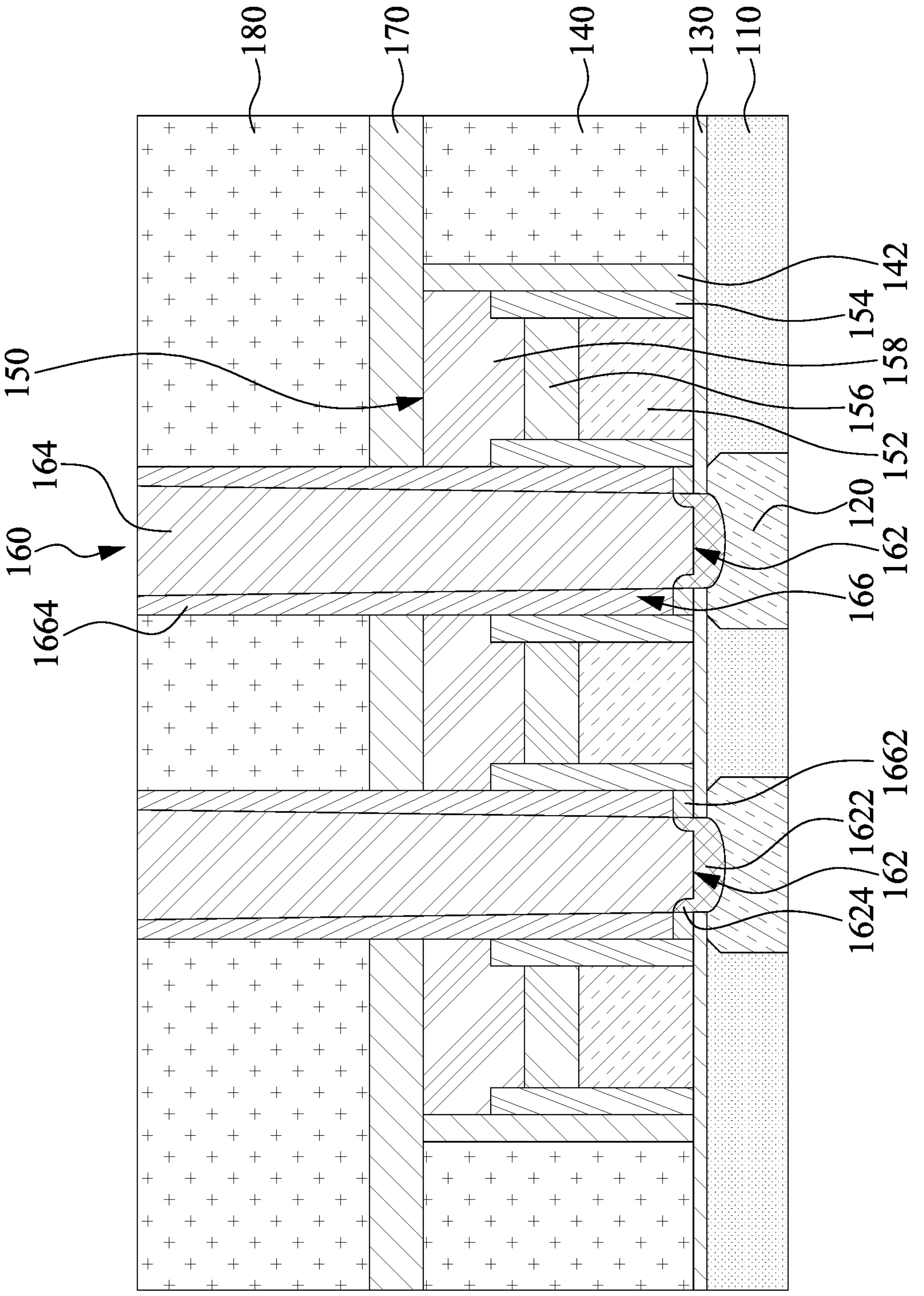

Referring to FIGS. 5E and 7E, in some embodiments, the silicide layer 500 is partially removed to expose an upper portion of the liner 400, which is simultaneously oxidized, so that the silicide cap 162 is formed along with the formation of the hybrid liner 162. Partially removing the silicide layer 500 is conducted through etching when applying oxygen for oxidization reaction. In some embodiment, oxygen is applied along with a carrier gas, such as $O_2/Cl_2$ in a ratio of about 1:1 to about 100:1, at a temperature of about 50° C. to about 400° C.

In some embodiments, as shown in FIGS. 1 and 2, a height H of the upper portion 1664 is greater than a height h of the lower portion 1662. In some another embodiments, the height H of the upper portion 1664 may be identical to the height h of the lower portion 1662. In some alternative embodiments, the height H of the upper portion 1664 may be less than the height h of the lower portion 1662. In some embodiments, the height H of the upper portion 1664 and the height h of the lower portion 1662 is at a ratio of about 40:1 to about 10:1. In some embodiments, the height H of the upper portion 1664 and the height h of the lower portion 1662 is at a ratio of about 30:1 to about 15:1.

At operation 206, as shown in FIGS. 4G, 5F, 6G and 7F, a metal material is applied onto the silicide cap 162 to form a contact plug 164 surrounded by the hybrid liner 162. In some embodiments, a planarization process, such as a chemical-mechanical polish (CMP) process, may be performed so that the contact plug 164 and the inter-metal dielectric layer 180 are coplanar as shown in FIG. 1. In some another embodiments, a planarization process, such as a chemical-mechanical polish (CMP) process, may be performed so that the contact plug 164 and the second etch stop layer 170 are coplanar as shown in FIG. 2. Then, an inter-metal dielectric layer 180 is formed onto the second etch stop layer 170, the gate structures 150 and the contact plug 164; and a plurality of plugs 182, 184 are formed in the inter-metal dielectric layer 180 so as to electrically contact the gate structures 150 and/or the contact plug 164.

In some embodiments, a semiconductor structure comprises a substrate with an epi-layer; at least one contact plug formed on the epi-layer and comprising: a silicide cap disposed on the epi-layer; a conductive pillar disposed on the silicide cap such that the conductive pillar electrically connects to the epi-layer via the silicide cap; and a hybrid liner surrounding the conductive pillar and comprising: a lower portion abutting the silicide cap and having a nitride material; and an upper portion abutting the conductive pillar and having an oxidized nitride material.

In some embodiments, a semiconductor structure comprises a substrate with an epi-layer; a first etch stop layer disposed on the substrate; a plurality of interlayer dielectric (ILD) structures and a plurality of gate structures formed on the first etch stop layer, wherein a top surface of each ILD structure and a top surface of each gate structure are coplanar; at least one contact plug formed on the epi-layer and comprising: a silicide cap disposed on the epi-layer; a conductive pillar disposed on the silicide cap such that the conductive pillar electrically connects to the epi-layer via the silicide cap; and a hybrid liner surrounding the conductive pillar and comprising: a lower portion abutting the silicide cap and having a nitride material; and an upper portion abutting the conductive pillar and having an oxidized nitride material; and a second etch stop layer disposed on the ILD structure and the dielectric layer of the gate structures and surrounding a portion of the conductive pillar.

In some embodiments, a method of manufacturing a semiconductor structure comprises receiving a structure with at least one through hole with a liner on a substrate; forming a silicide layer along the liner and on the substrate; forming a metal layer in the through hole to cover the silicide layer; partially removing the metal layer from the through hole to expose an upper portion of the silicide layer; removing the upper portion of the silicide layer to form a silicide cap covered by a residual metal layer and partially oxidizing the liner to form a hybrid liner; and applying a metal material onto the residual metal layer to form a contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:

a substrate with an epi-layer;

a first etch stop layer disposed on the substrate;

a plurality of interlayer dielectric (ILD) structures and a plurality of gate structures formed on the first etch stop layer, wherein a top surface of each ILD structure and a top surface of each gate structure are coplanar;

at least one contact plug formed on the epi-layer and comprising:

a silicide cap disposed on the epi-layer;

a conductive pillar disposed on the silicide cap such that the conductive pillar electrically connects to the epi-layer via the silicide cap; and a hybrid liner surrounding the conductive pillar and comprising:

a lower portion abutting the silicide cap and having a nitride material; and an upper portion abutting the conductive pillar and having an oxidized nitride material; and a second etch stop layer disposed on the ILD structure and the dielectric layer of the gate structures and surrounding a portion of the conductive pillar, wherein a height of the upper portion of the hybrid liner is greater than or equal to a height of the lower portion of the hybrid liner.

2. The semiconductor structure of claim 1, further comprising an inter-metal dielectric layer formed on the second etch stop layer, wherein the contact plug extends upward and passes through the second etch stop layer and the inter-metal dielectric layer so that a top surface of the contact plug is coplanar with an upper surface of the inter-metal dielectric layer.

3. The semiconductor structure of claim 1, wherein a top of the upper portion of the hybrid liner and a top surface of the conductive pillar are coplanar with a top surface of the second etch stop layer.

4. The semiconductor structure of claim 3, further comprising an inter-metal dielectric layer formed on the second etch stop layer and the conductive pillar.

5. The semiconductor structure of claim 4, further comprising a plurality of plugs formed in the inter-metal dielectric layer, wherein an upper surface of each of the plurality of plugs is coplanar with the upper surface of the inter-metal dielectric layer.

6. The semiconductor structure of claim 5, wherein at least one of the plurality of plugs is formed on the conductive pillar and electrically contacts the conductive pillar; and at least one of the plurality of plugs is formed on the conductive layer of the gate structure and electrically contacts the gate structure.

7. The semiconductor structure of claim 1, a ratio of the height of the upper portion of the hybrid liner to the height of the lower portion of the hybrid liner ranges from about 50:1 to about 1:1.

8. A semiconductor structure, comprising:

a substrate with an epi-layer;

a first etch stop layer disposed over the substrate;

an interlayer dielectric (ILD) structure;

at least one contact plug disposed in the ILD structure and over the epi-layer, and comprising:

a silicide cap having a U-shape cross section, disposed on the epi-layer, and comprising:

a cap body disposed on the epi-layer; and a cap wall protruding from an edge of the cap body toward a direction opposite to the epi-layer and surrounding a lower portion of the conductive pillar, wherein a thickness of the cap wall is less than a thickness of the cap body;

a conductive pillar disposed over the cap body of the silicide cap and partially surrounded by the cap wall of the silicide cap, wherein the conductive pillar is separated from the epi-layer by the cap body;

a liner disposed over the first etch stop layer and surrounding the contact plug and comprising:

a lower portion abutting the cap wall of the silicide cap and having a nitride material; and an upper portion abutting the conductive pillar and having an oxidized nitride material; and a second etch stop layer disposed over the ILD structure and surrounding a portion of the conductive pillar, wherein a top of the conductive pillar is substantially coplanar with a top of the second etch stop layer, and wherein a height of the upper portion of the liner is greater than or equal to a height of the lower portion of the liner.

9. The semiconductor structure of claim 8, further comprising a gate structure separated from the contact plug by the liner.

10. The semiconductor structure of claim 8, wherein a top of the lower portion of the liner is substantially coplanar with a top of the cap wall of the silicide cap.

11. The semiconductor structure of claim 9, wherein the gate structure comprising:

a gate electrode formed over the first etch stop layer;

a spacer formed along a sidewall of the gate electrode, so that the spacer is sandwiched between the gate electrode and the liner;

a conductive layer formed over the gate electrode and surrounded by the spacer; and a dielectric layer formed on the conductive layer and the spacer so as to abut the contact plug.

12. The semiconductor structure of claim 11, wherein a top of the cap wall is lower than a top of the gate electrode.

13. The semiconductor structure of claim 11, wherein a top of the gate electrode is lower than a top of the spacer of the gate structure.

14. The semiconductor structure of claim 11, further comprising a gate plug disposed on and electrically connecting to the conductive layer of the gate structure.

15. The semiconductor structure of claim 8, wherein a top of the upper portion of the liner is coplanar with the top of the conductive pillar and the top of the second etch stop layer.

16. A semiconductor structure, comprising:

a substrate with an epi-layer;

a first etch stop layer disposed over the substrate;

an interlayer dielectric (ILD) structure;

at least one contact plug disposed in the ILD structure and over the epi-layer, and comprising:

a silicide cap disposed on the epi-layer, and comprising:

a cap body disposed on the epi-layer; and a cap wall protruding from an edge of the cap body toward a direction opposite to the epi-layer and surrounding a lower portion of the conductive pillar, wherein a thickness of the cap wall is less than a thickness of the cap body;

a conductive pillar disposed over the cap body of the silicide cap and partially surrounded by the cap wall of the silicide cap, wherein the conductive pillar is separated from the epi-layer by the cap body;

a hybrid liner disposed over the first etch stop layer and surrounding the contact plug and comprising:

a lower portion abutting the cap wall of the silicide cap; and an upper portion abutting the conductive pillar; and a second etch stop layer disposed over the ILD structure and surrounding a portion of the conductive pillar, wherein a top of the conductive pillar is substantially coplanar with a top of the second etch stop layer and is substantially coplanar with a top of the hybrid liner, and wherein a height of the upper portion of the hybrid liner is greater than or equal to a height of the lower portion of the hybrid liner.

17. The semiconductor structure of claim 16, wherein a material of the lower portion of the hybrid liner is different from a material of the upper portion of the hybrid liner.

18. The semiconductor structure of claim 17, wherein the lower portion is made of nitride and the upper portion is made of oxidized nitride.

19. The semiconductor structure of claim 17, further comprising a gate structure disposed between the first etch stop layer and the second etch stop layer, the gate structure comprising:

a gate electrode disposed over the first etch stop layer;

a spacer disposed along a sidewall of the gate electrode, so that the spacer is sandwiched between the gate electrode and the hybrid liner;

a conductive layer disposed over the gate electrode and surrounded by the spacer; and a dielectric layer disposed on the conductive layer and partially surrounded the spacer.

20. The semiconductor structure of claim 19, wherein the gate structure is separated from the conductive pillar by the hybrid liner, and is separated from the ILD structure by a barrier.

* * * * *